United States Patent
Kang

(10) Patent No.: US 7,009,907 B2
(45) Date of Patent: Mar. 7, 2006

(54) FERAM HAVING SENSING VOLTAGE CONTROL FUNCTION

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 39 days.

(21) Appl. No.: 10/876,490

(22) Filed: Jun. 28, 2004

(65) Prior Publication Data

US 2005/0135141 A1     Jun. 23, 2005

(30) Foreign Application Priority Data

Dec. 23, 2003    (KR) ...................... 10-2003-0095302

(51) Int. Cl.
*G11C 8/00*     (2006.01)

(52) U.S. Cl. .................................. 365/230.03; 365/196

(58) Field of Classification Search ................ 365/196, 365/230.03

See application file for complete search history.

(56) References Cited

U.S. PATENT DOCUMENTS

| 6,272,594 | B1 |   | 8/2001  | Gupta et al. |             |
|-----------|----|---|---------|--------------|-------------|
| 6,363,439 | B1 |   | 3/2002  | Battles et al.|            |
| 6,829,154 | B1 | * | 12/2004 | Kang ........ | 365/145     |
| 6,836,439 | B1 | * | 12/2004 | Kang ........ | 365/200     |

FOREIGN PATENT DOCUMENTS

KR         1998-14400         7/2000

* cited by examiner

*Primary Examiner*—Michael Tran
(74) *Attorney, Agent, or Firm*—Heller Ehrman LLP

(57) ABSTRACT

The present invention discloses a non-volatile ferroelectric memory device having a sensing voltage control circuit. The non-volatile ferroelectric memory device having a sensing voltage control circuit comprises: a plurality of cell array blocks having a hierarchy bit line architecture having main bit lines and sub bit lines; a plurality of sense amplifier units sensing a voltage on the main bit line according to a sensing detection threshold voltage, and adjusting a level of the sensing detection threshold voltage according to a temperature; a data bus transferring a read/write data; and a main amplifier amplifying the read data, and outputting the amplified read data. Therefore, the FeRAM of the present invention enables a stable data sensing by compensating through the sense amplifier the signal transfer characteristics of the main bit line according to the temperature change.

19 Claims, 19 Drawing Sheets

FERAM HAVING SENSING VOLTAGE CONTROL FUNCTION

BACKGROUND OF THE INVENTION

1. Field of the Invention

The present invention relates in general to a non-volatile ferroelectric memory device having a sensing voltage control function, and more particularly, to a non-volatile ferroelectric memory device, wherein a sense amp compensates a sensing voltage difference in a main bit line caused by a temperature change, thereby obtaining a stable data sensing.

2. Description of the Related Art

In general, a non-volatile ferroelectric memory, i.e., a FeRAM (Ferroelectric Random Access Memory), has a data processing speed equal to that of a DRAM (Dynamic Random Access Memory) and also is capable of preserving stored data even when the power is off. The FeRAM and DRAM are memory devices with similar structures, but the FeRAM uses a capacitor made of a ferroelectric material to benefit a high residual polarization characteristic of the ferroelectric material. The residual polarization of the ferroelectric capacitor allows data to be maintained in an FeRAM memory cell and not erased even if an electric field applied to the memory cell is removed.

The general techniques and ideas associated with the above-described FeRAM have been already disclosed in Korean Patent Application No. 1998-14400 applied by the same inventor. Therefore, basic structure and operational principles of the FeRAM will not be further discussed here.

However, as the operational voltage of a chip of the FeRAM is getting lower, a sensing voltage of a cell is also reduced. In effect, this caused much difficulty in obtaining a high-speed operation in a circuit having a 1T1C (1-Transistor 1-Capacitor) structure.

Especially when the sensing voltage of a cell data is low, a voltage margin for sensing timing is reduced. Therefore, if a temperature change in a memory is great, a bit line sensing voltage fluctuates greatly. In other words, when the temperature change in a memory is great, it is very difficult to detect the sensing voltage of a bit line using a fixed sensing threshold voltage.

SUMMARY OF THE INVENTION

It is, therefore, an object of the present invention to provide an FeRAM having a sensing voltage control function, to realize a stable data sensing by compensating, through a sense amp, a sensing voltage difference in a main bit line caused by a temperature change.

To achieve the above object, there is provided a non-volatile ferroelectric memory device having a sensing voltage control circuit, the device including: a plurality of cell array blocks; a plurality of sense amp units; a data bus and a main amp unit. The cell array block has a hierarchy bit line architecture including main bit lines and sub bit lines, and stores data in unit cells selectively connected to the sub bit lines. Preferably, the sense amps are in a one-to-one correspondence to the cell array blocks, each sensing a voltage on the main bit line according to a sensing detection threshold voltage and adjusting a level of the sensing detection threshold voltage according to a temperature change. Preferably, the data bus transfers a read data sensed by the sense amp and a write data to be transferred to the sense amp. Preferably, the main amp unit amplifies the read data applied from the data bus, and outputs the amplified read data to a data buffer.

BRIEF DESCRIPTION OF THE DRAWINGS

The above objects, features and advantages of the present invention will become more apparent from the following detailed description when taken in conjunction with the accompanying drawings, in which.

DETAILED DESCRIPTION OF THE PREFERRED EMBODIMENT

A preferred embodiment of the present invention will be described herein below with reference to the accompanying drawings.

Figure 1:
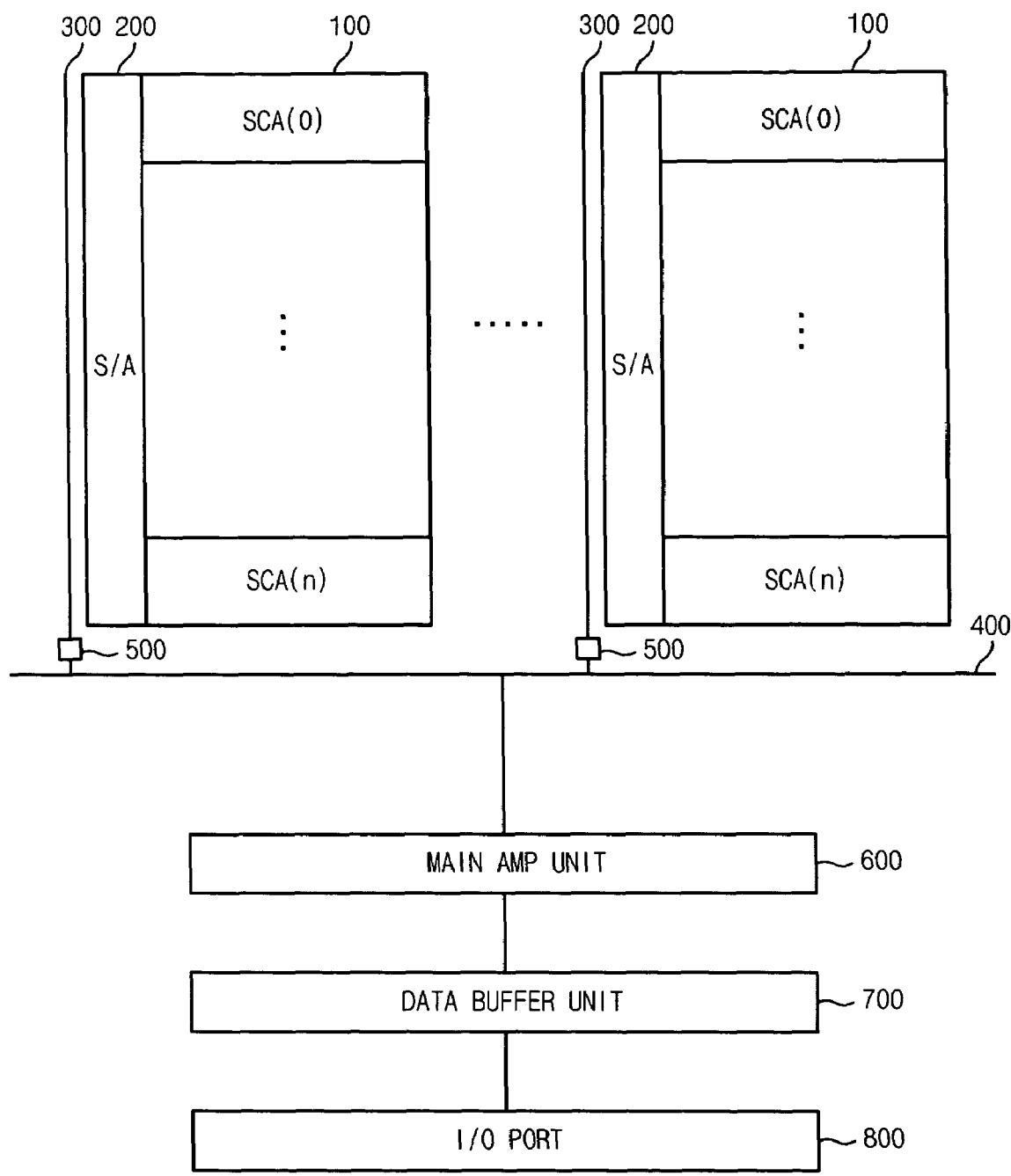
FIG. 1 is a schematic block diagram of a non-volatile ferroelectric memory device according a first embodiment of the present invention.

FIG. 1 is a schematic block diagram of a non-volatile ferroelectric memory device according a first embodiment of the present invention.

The ferroelectric memory device of the invention includes a plurality of cell array blocks 100, a plurality of sense amp units 200, a plurality of local data buses 300, a global data bus 400, a plurality of data bus switches 500, a main amp unit 600 and a data buffer unit 700.

The cell array block 100 consists of a plurality of a sub cell arrays SCA(0)–SCA(n). Each sub cell array SCA(0)–SCA(n) includes a cell array for data storage. Particularly, the cell array block 100 of the present invention has a hierarchy bit line architecture in which a plurality of sub bit lines is coupled to one main bit line. A sensing voltage on the main bit line is determined in dependence of the voltage level of a sub bit line to which a cell data is applied. Here, one sub bit line is provided to the respective sub cell arrays SCA(0)–SCA(n), but the main bit line is shared by all of the sub cell arrays SCA(0)–SCA(n).

The sense amp unit 200 senses the sensing voltage on the main bit line and selectively outputs the sensing voltage to a local data bus 300. Also, the sense amp unit 200 transfers a write data applied through the local data bus 300 to the main bit line of the cell array block 100. The sense amp unit 200 is located between the cell array block 100 and the local data bus line 300, respectively, to be in a one-to-one correspondence to the cell array block 100, and an input/output (I/O) port at one side is directly connected to the main bit line. That is, although a related art sense amp unit sensed a cell data applied through a common data bus, the sense amp unit 200 of the present invention directly senses the voltage on the main bit line without through the common data bus. Further, the sense amp unit 200 of the present invention is capable of adjusting a sensing detection threshold voltage when the sensing voltage level of the main bit line changes due to a temperature change, and ensures data sensing to be stable.

The local data bus 300 transfers a read data sensed by the sense amp unit 200 to the global data bus 400, and transfers a write data applied through the global data bus 400 to the sense amp unit 200. The local data bus 300 is installed at one side of the sense amp unit 200 to be in a one-to-one correspondence to the cell array block 100. Also, the local data bus 300 includes a certain number of bus lines corresponding to the number of bits in a data inputted or outputted at the same time with a one-time column selection.

The respective local data buses 300 are selectively coupled to the global data bus 400 according to an on/off operation of the data bus switch 500, thereby sharing the global data bus 400.

The global data bus 400 transfers to the main amp 600 the read data applied from the local data bus 300, and transfers to the local data bus 300 the write data applied from the main amp unit 600. As described above, the global data bus 400 is selectively coupled to one of the plurality of local data buses 300, according to the on/off operation of the data bus switch 500.

The main amp unit 600 amplifies the read data applied from the global data bus 400 and transfers it to the data buffer unit 700, and amplifies the write data applied through the data buffer unit 700 and transfers it to the global data bus 400.

The data buffer 700 buffers the read data to be outputted outside and then transfers it to an I/O port 800, and buffers the write data inputted through the I/O port 800 from outside and transfers it to the main amp 600.

Figure 2:
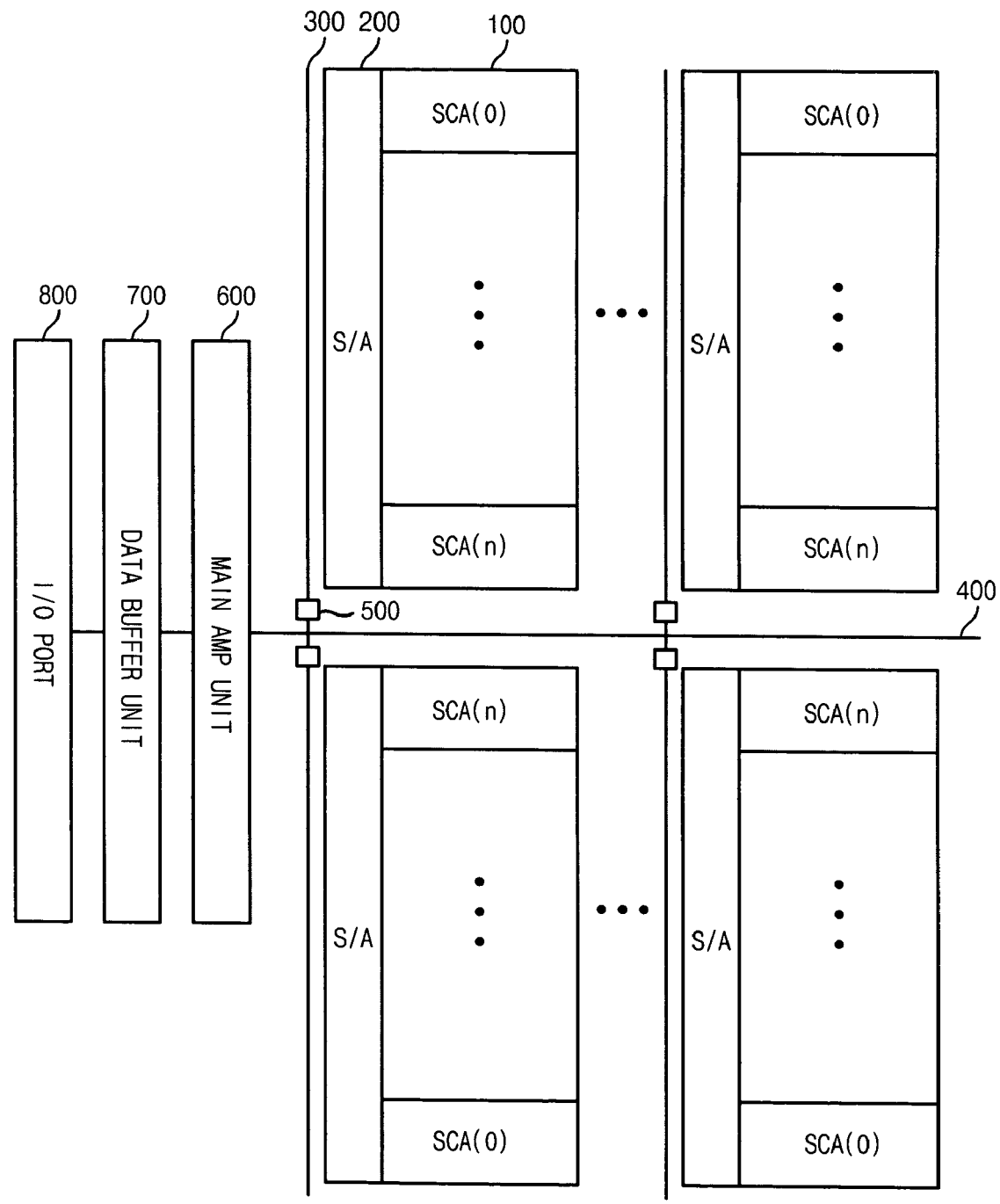
FIG. 2 is a schematic block diagram of a non-volatile ferroelectric memory device according a second embodiment of the present invention.

FIG. 2 is a schematic block diagram of a non-volatile ferroelectric memory device according a second embodiment of the present invention.

In this embodiment shown in FIG. 2, the cell array blocks 100 are divided into two (an upper cell array block and a lower cell array block) by the global data bus 400, being vertically symmetric. And, the sense amp unit 200 and the local data bus 300 in a one-to-one correspondence, as shown in FIG. 1, are provided to the upper and lower cell array blocks 100.

The upper and lower local data buses 300 share the global data bus 400 through the data bus switch 500.

The structure and operation of other elements are same with those in FIG. 1.

Figure 3:
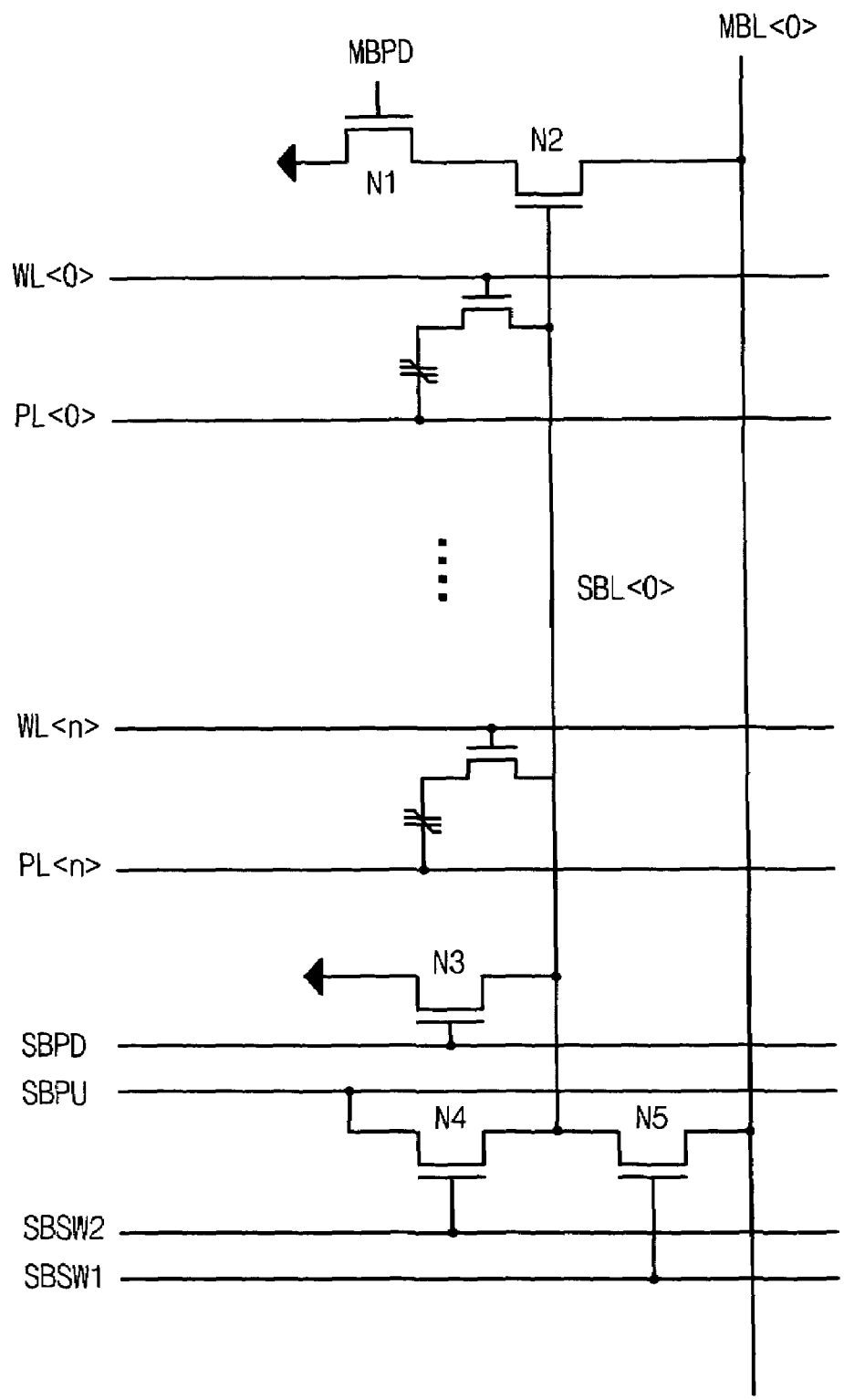
FIG. 3 is a circuit diagram illustrating in more detail a sub cell array of a cell array block in FIG. 1 and FIG. 2.

FIG. 3 is a circuit diagram illustrating in detail the structure of one sub cell array SCA(0) among the sub cell arrays SCA(0)–SCA(n) in the cell array block 100 shown in FIG. 1 and FIG. 2.

One main bit line MBL is coupled to a plurality of sub bit lines SBL, and during a read/write operation the main bit line MBL is selectively coupled to one of sub bit lines SBL. FIG. 3 illustrates a connection relation between the main bit line MBL<0> and the sub bit line SBL<0> in the sub cell array SCA(0).

When an NMOS transistor N5 is turned on after a sub bit line selection signal SBS1 is activated, load on the main bit line MBL<0> is adjusted to one sub bit line level. In addition, when an NMOS transistor N3 is turned on after a sub bit line pull-down signal SBPD is activated, the sub bit line SBL<0> is adjusted to the ground voltage level.

A sub bit line pull-up signal SBPU is a signal for adjusting power supply to the sub bit line SBL<0>, and a sub bit line selection signal SBSW2 adjusts a signal flow between a line for the sub bit line pull-up signal SBPU and the sub bit line SBL<0>, ensuring the sub bit line pull-up signal SBPU to be applied to the sub bit line SBL<0>. For example, to generate a high voltage to the sub bit line SBL<0>, a higher voltage than the power voltage VCC is supplied, responding to the sub bit line pull-up signal SBPU, and the sub bit line selection signal SBSW2 is activated. Following the activation of the sub bit line selection signal SBSW2, an NMOS transistor N4 is turned on and the sub bit line pull-up signal SBPU with a high voltage is provided to the sub bit line SBL<0>.

And, a plurality of unit cells is connected to the sub bit line SBL<0>.

An NMOS transistor N1 is connected between the ground voltage node and an NMOS transistor N2 and has a gate to which a main bit line pull-down signal MBPD is applied. An NMOS transistor N2 is connected between the NMOS transistor N1 and the main bit line MBL<0> and has a gate connected to the sub bit line SBL<0>. When the main bit line pull-down signal MBPD is activated, channel resistance of the NMOS transistor N2 is changed according to the sensing voltage on the sub bit line SBL<0>. In such case, the NMOS transistor N2 adjusts the amount of current flowing from the main bit line MBL<0> to the ground voltage to induce a voltage change on the main bit line MBL<0> according to a cell data. For example, if the data value in the cell is high, the voltage on the sub bit line SBL<0> is raised higer than the data value in the cell is low and thus, the amount of current flowing through the NMOS transistor N2 becomes larger. As a result, the voltage level of the main bit line MBL<0> is reduced to a great degree. On the contrary, if the data value in the cell is low, the voltage on the sub bit line SBL<0> is raised lower than the data value in the cell is high and thus, the amount of current flowing through the NMOS transistor N2 becomes smaller. In this case, however, the voltage level of the main bit line MBL<0> is reduced only slightly. In short, the voltage level of the main bit line MBL varies depending on the cell data. Based on this mechanism, therefore, a data in a selected cell can be sensed.

Figure 4:
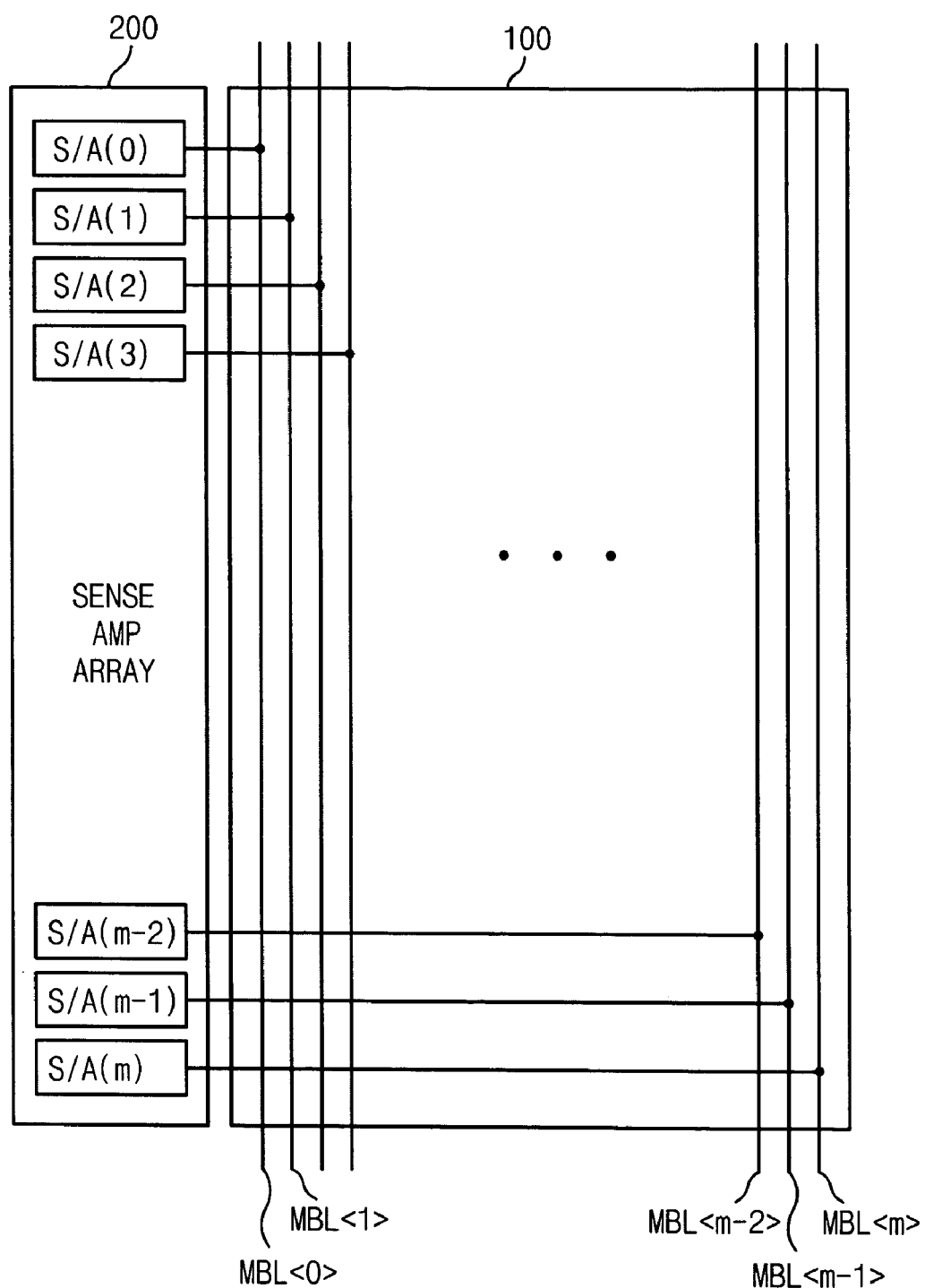
FIG. 4 is a schematic diagram illustrating a connection relation between main bit lines in a cell array block and sense amp.

FIG. 4 is a schematic diagram illustrating a connection relation between main bit lines MBL<0>–MBL<m> in a cell array block and a sense amp 200.

In each cell array block 100, a plurality of main bit lines MBL<0>–MBL<m> is aligned vertically parallel to each other.

The sense amp unit 200 consists of a plurality of sense amps S/A<0>–S/A<m>, each in a one-to-one correspondence to the respective main bit lines MBL<0>–MBL<m>.

Each sense amp S/A<0>–S/A<m> senses the voltage on the main bit line MBL, and transfers a sensed read data to the local data bus 300, in response to a column selection signal. Also, the sensed read data is transferred to the main bit line MBL and is restored in the cell array block 100. And, each sense amp S/A<0>–S/A<m> transfers to the main bit line MBL a write data inputted through the local data bus 300.

Figure 5:
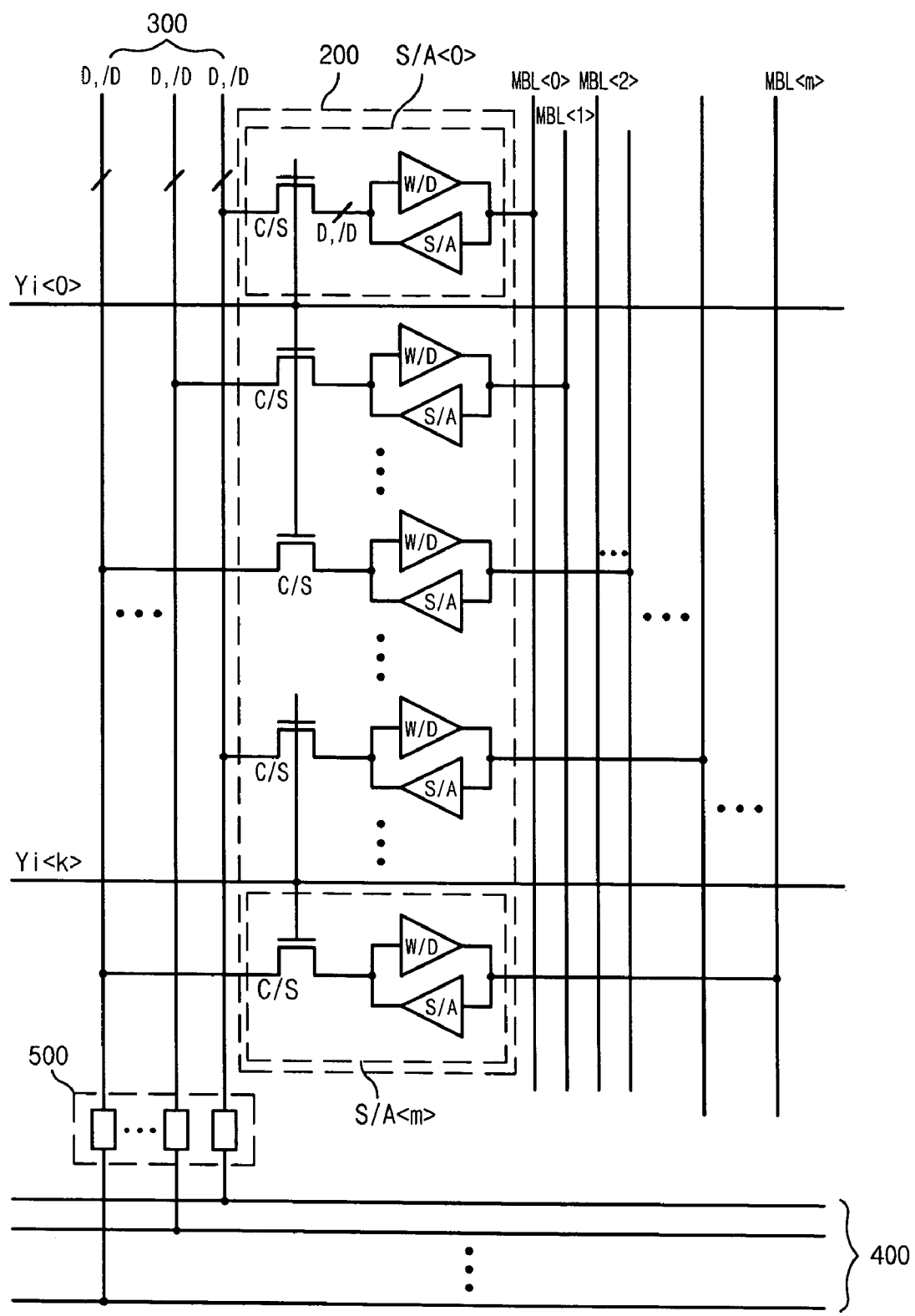
FIG. 5 is a schematic diagram illustrating a relation between sense amp and data bus in more details.

FIG. 5 is a schematic diagram elaborating the relation between the sense amp unit 200 and data buses 300, 400.

One I/O port of each sense amp S/A<0>–S/A<m> is connected to the respective main bit lines MBL<0>–MBL<m>, and the other I/O port of each sense amp S/A<0>–S/A<m> is connected to the local data bus 300.

In read mode, each sense amp S/A<0>–S/A<m> senses the sensing voltage on the respective main bit lines MBL<0>–MBL<m> and outputs a read data to the local data bus 300, in response to the column selection signals Yi<0>–Yi<K>. Moreover, each sense amp S/A<0>–S/A<m> transfers the sensed read data to the main bit line MBL through a write driver W/D to restore the data.

In write mode, each sense amp S/A<0>–S/A<m> transfers to the main bit lines MBL<0>–MBL<m> a write data applied from the local data bus 300 according to the column selection signals Yi<0>–Yi<K>, to record the write data in the cell array block 100. At this time, the number of sense amps to which the same column selection signal Yi<0>–Yi<K> is applied is equivalent to the number of bits in a data that is inputted or outputted at the same time with a one-time column selection.

The local data bus 300 is selectively coupled to the global data bus 400 through the data bus switch 500.

Figure 6:
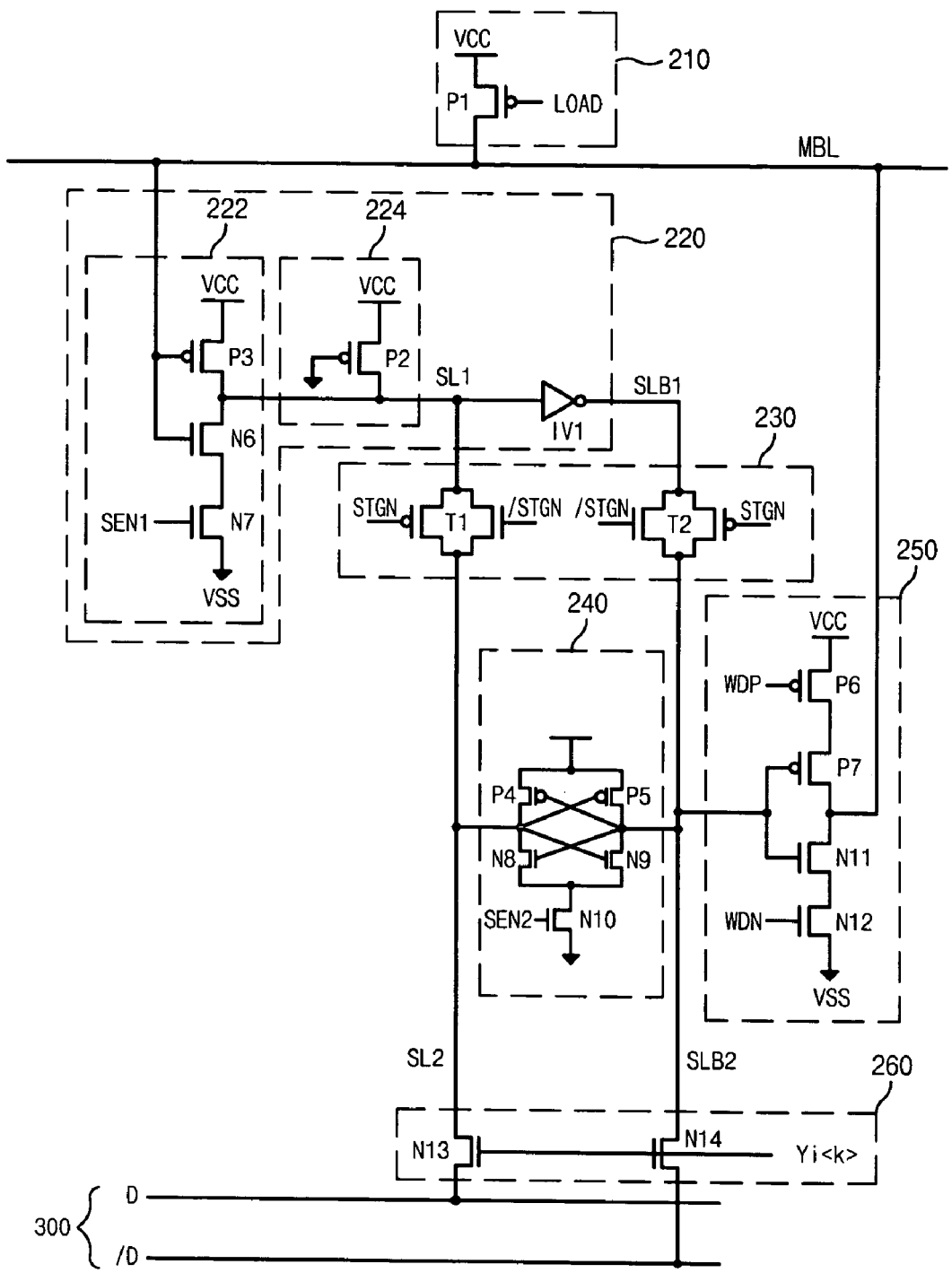
FIG. 6 is a detailed circuit diagram illustrating the structure of each sense amp according to a first embodiment of the present invention.

FIG. 6 is a detailed circuit diagram illustrating the structure of each sense amp S/A<0>–S/A<m>, according to a first embodiment of the present invention.

A respective sense amp S/A<0>–S/A<m> consists of a sensing load unit 210, a sensing amplifying unit 220, a data transfer unit 230, a data latch unit 240, a write driving unit 250, and a column switch 250.

The sensing load unit 210 controls a sensing load on the main bit line MBL according to a sensing load signal LOAD.

The sensing load unit 210 includes a PMOS transistor P1 connected between the power voltage VCC and the main bit line MBL, the PMOS transistor P1 having a gate where the sensing load signal LOAD is applied.

The sensing amplifying unit 220, being activated by a sensing control signal SEN1, senses the sensing voltage on the main bit line MBL and amplifies it. At this time, the sensing amplifying unit 220 receives the sensing voltage of the main bit line MBL as a single input, and if the sensing voltage is greater than the sensing detection threshold voltage Vt the sensing amplifying unit 220 outputs a low level signal, and if the sensing voltage is less than the sensing detection threshold voltage Vt the sensing amplifying unit 220 outputs a high level signal. In other words, a logic decision voltage of the sensing amplifying unit 220 is made equal to the logic threshold voltage (sensing detection threshold voltage) Vt of the PMOS transistor P3 and the NMOS transistor N6. Particularly, if the voltage on the main bit line MBL is changed due to a temperature change, the sensing amplifying unit 220 automatically adjusts the level of the sensing detection threshold voltage accordingly. In effect, the sensing amplifying unit 220 is capable of sensing a cell data applied to the main bit line MBL more stably, without being affected by the temperature change. This type of sensing amplifying unit 220 includes an input sensing part 222, a sensing load adjusting part 224, and an inverter IV1.

The input sensing part 222, according to the logic threshold voltage (sensing detection threshold voltage) of the PMOS transistor P3 and the NMOS transistor N6, senses the voltage on the main bit line MBL and amplifies it. The sensing load adjusting part 224 adjusts or varies a load on the output node of the input sensing part 222 according to the temperature change, and changes the sensing detection threshold voltage of the input sensing part 222, thereby compensating a signal transfer characteristic of the main bit line MBL against the temperature change. The inverter IV1 inverts an output from the input sensing part 222.

The input sensing part 222 consists of the PMOS transistor P3, and NMOS transistors N6 and N7. The PMOS transistor P3 is connected between a power voltage node VCC and a node SL1 and has a gate connected to the main bit line MBL. The respective NMOS transistors N6 and N7 are serially connected between the node SL1 and a ground voltage VSS, and have gates to which the sensing voltage on the main bit line MBL and a sensing control signal SEN1 are applied, respectively. The sensing load adjusting part 224 includes a PMOS transistor P2 that is connected between a power voltage VCC and the node SL1. The gate of the PMOS transistor P2 is grounded, which is why the PMOS transistor P2 is in 'on' state all the time. In an active section, the sensing control signal SEN1 is kept in a high level.

With the above-described constitution, the sensing amplifying unit 220 compares the voltage on the main bit line MBL to the logic threshold voltage (sensing detection threshold voltage) of the PMOS transistor P3 and the NMOS transistor N6, senses a cell data, amplifies the cell data, and outputs it. Therefore, in the present invention, unlike in the related art, there is no need to generate a reference voltage for data sensing. Moreover, the PMOS transistor P2 of the sensing load adjusting part 224 is always in 'on' state, supplying a variable power voltage to the node SL1 according to the temperature change and thereby, adjusting the sensing detection threshold voltage Vt of the input sensing part 222. Thanks to the performance of the PMOS transistor P2, the voltage characteristic change of the main bit line MBL caused by the temperature change can be compensated.

The data transfer unit 230 selectively transfers data in the nodes SL1, SLB1 to the data latch unit 240.

The data transfer unit 230 is turned on/off in response to a control signal STGN, and consists of transfer gates T1, T2, transferring data in those two output nodes SL1, SLB1 to the data latch unit 230, respectively.

The data latch unit 240 is activated by a sensing control signal SEN2 and stores a read data transmitted through the data transfer unit 230 or a write data transmitted through the column switch 260.

Here, the data latch unit 240 consists of a pair of PMOS transistors P4, P5 and a pair of NMOS transistors N8, N9, each pair having a cross-coupled latch circuit structure, and an NMOS transistor N10 for activating the latch circuit at the time the sensing control signal SEN2 is activated.

The write driving unit 250 is activated by write control signals WDN, WDP during a data write operation or a restore operation, and transfers stored data in the data latch unit 240 to the main bit line MBL.

The write driving unit 250 consists of PMOS transistors P6, P7, which are serially connected between a power voltage VCC and the main bit line MBL, and NMOS transistors N11, N12, which are connected between the main bit line MBL and a ground voltage VSS. Here, the write control signals WDP, WDN are applied to the gate of the PMOS transistor P6 and NMOS transistor N12, respectively, and the gate of the PMOS transistor P7 and the gate of the NMOS transistor N11 are commonly connected to the node SLB2.

The column switch 260 selectively connects two nodes SL2, SLB2 of the data latch unit 240 to the local data bus 300, in response to the column selection signal Yi<k>.

The column switch 260 consists of an NMOS transistor N13, which is connected between the node SL2 and a local data bus D and has a gate where the column selection signal Yi<k> is applied, and an NMOS transistor N14, which is connected between the node SLB2 and the local data bus D and has a gate where the column selection signal Yi<k> is applied.

Figure 7:
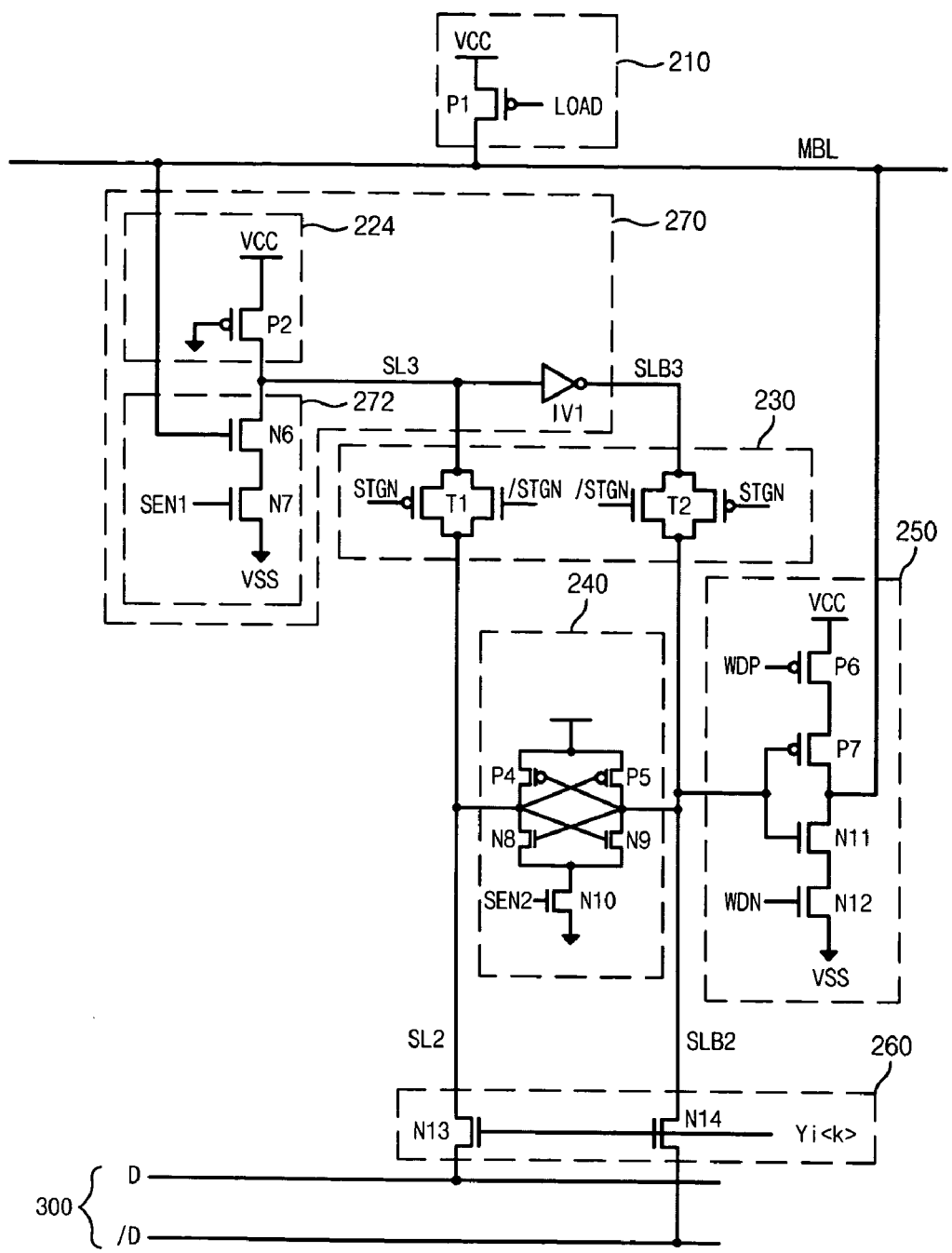
FIG. 7 is a detailed circuit diagram illustrating the structure of each sense amp according to a second embodiment of the present invention.

FIG. 7 is a circuit diagram illustrating in detail the structure of each sense ample S/A<0>–S/A<m> according to a second embodiment of the present invention.

Although a sensing amplifying unit 270 in FIG. 7 has a different structure from that of the sensing amplifying part 220 in FIG. 6, the other elements are same with those in FIG. 6 both in operations and structures. In simplicity and for comparison, same reference numerals used in FIG. 6 are used again for the same elements shown in FIG. 6.

As shown in FIG. 7, an input sensing part 272 of the sensing amplifying unit 270 consists of only NMOS transistors N6 and N7, serially connected between a node SL3 and a ground voltage. The input sensing part 272 outputs a low level signal only if the sensing voltage on the main bit line MBL is greater than the threshold voltage of the NMOS transistor N6. That is, the logic decision voltage of the sensing amplifying unit 270 is equal to the logic threshold voltage (sensing detection threshold voltage) Vt of the NMOS transistor N6.

Figure 8:
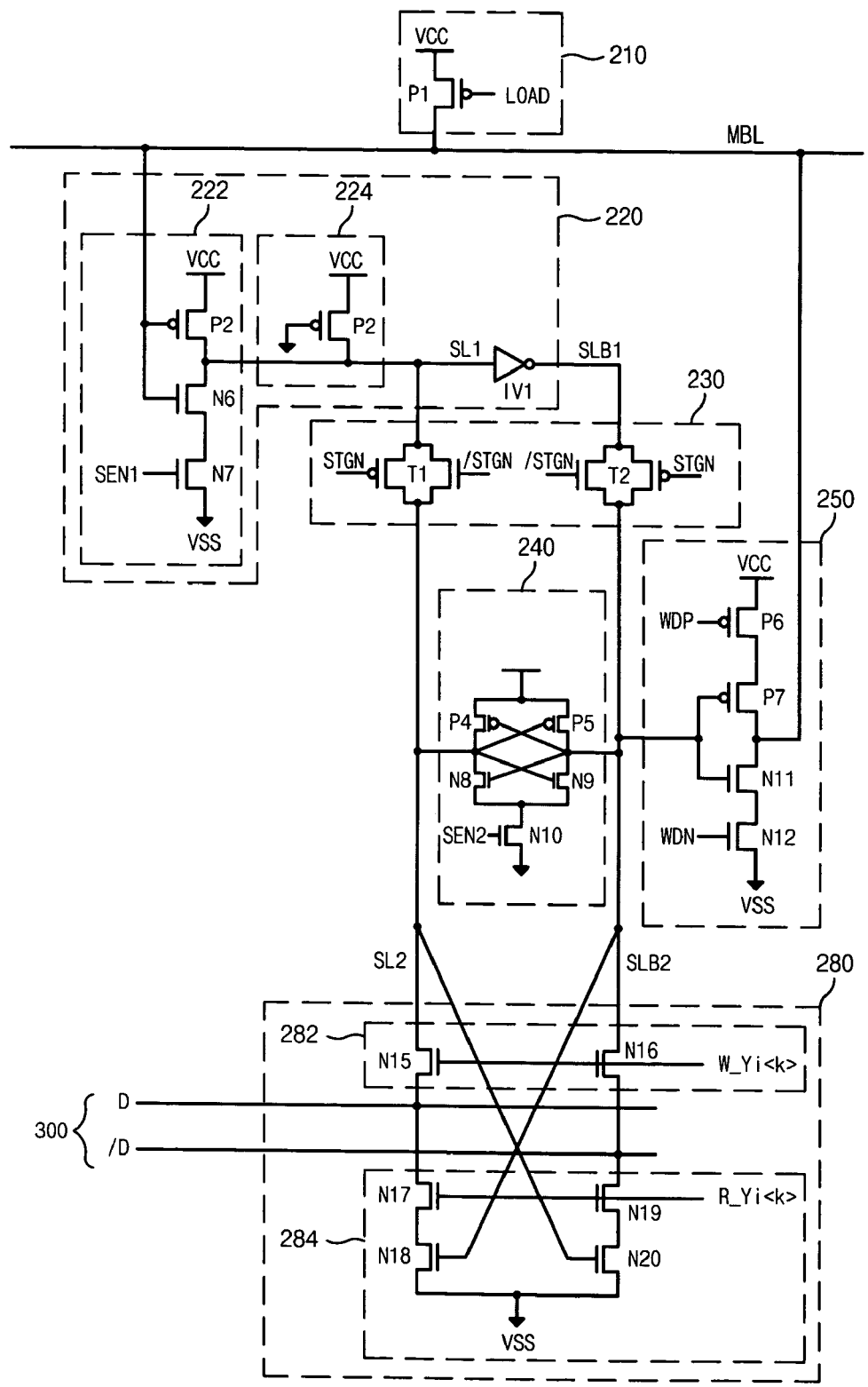
FIG. 8 is a detailed circuit diagram illustrating the structure of each sense amp according to a third embodiment of the present invention.

FIG. 8 is a circuit diagram illustrating in detail the structure of each sense ample S/A<0>–S/A<m> according to a third embodiment of the present invention.

Although a column switch 280 in FIG. 8 has a different structure from that of the column switch unit 260 in FIG. 6, the other elements are same with those in FIG. 6 both in operations and structures. In simplicity and for comparison, same reference numerals used in FIG. 6 are used again for the same elements shown in FIG. 6.

As shown in FIG. 8, the column switch 280 includes a write switch 282 and a read switch 284.

The write switch 282 transfers a write data applied from the local data bus 300 to the data latch unit 240, in response to a write column selection signal W_Yi<k>.

The write switch 282 consists of an NMOS transistor N15, which is connected between the node SL2 and the local data bus D and has a gate where the write column selection signal W_Yi<k> is applied, and an NMOS transistor N16, which is connected between the node SLB2 and a local data bus/D and has a gate where the column selection signal W_Yi<k> is applied.

The read switch 284, on the other hand, transfers a data stored in the data latch unit 240 to the local data bus 300, in response to a read column selection signal R_Yi<k>. Here, the switch 284 consists of NMOS transistors N17, 18 serially connected between the local data bus D and the ground voltage VSS, and NMOS transistors N19, N20 serially connected between the local data bus /D and the ground voltage VSS. Here, a read column selection signal R_Yi<n> is applied to the gate of the NMOS transistors N17 N19, respectively, and the gate of the NMOS transistor N18 and the gate of the NMOS transistor N20 are connected to the node SLB2 and the node SL2, respectively.

Figure 9:
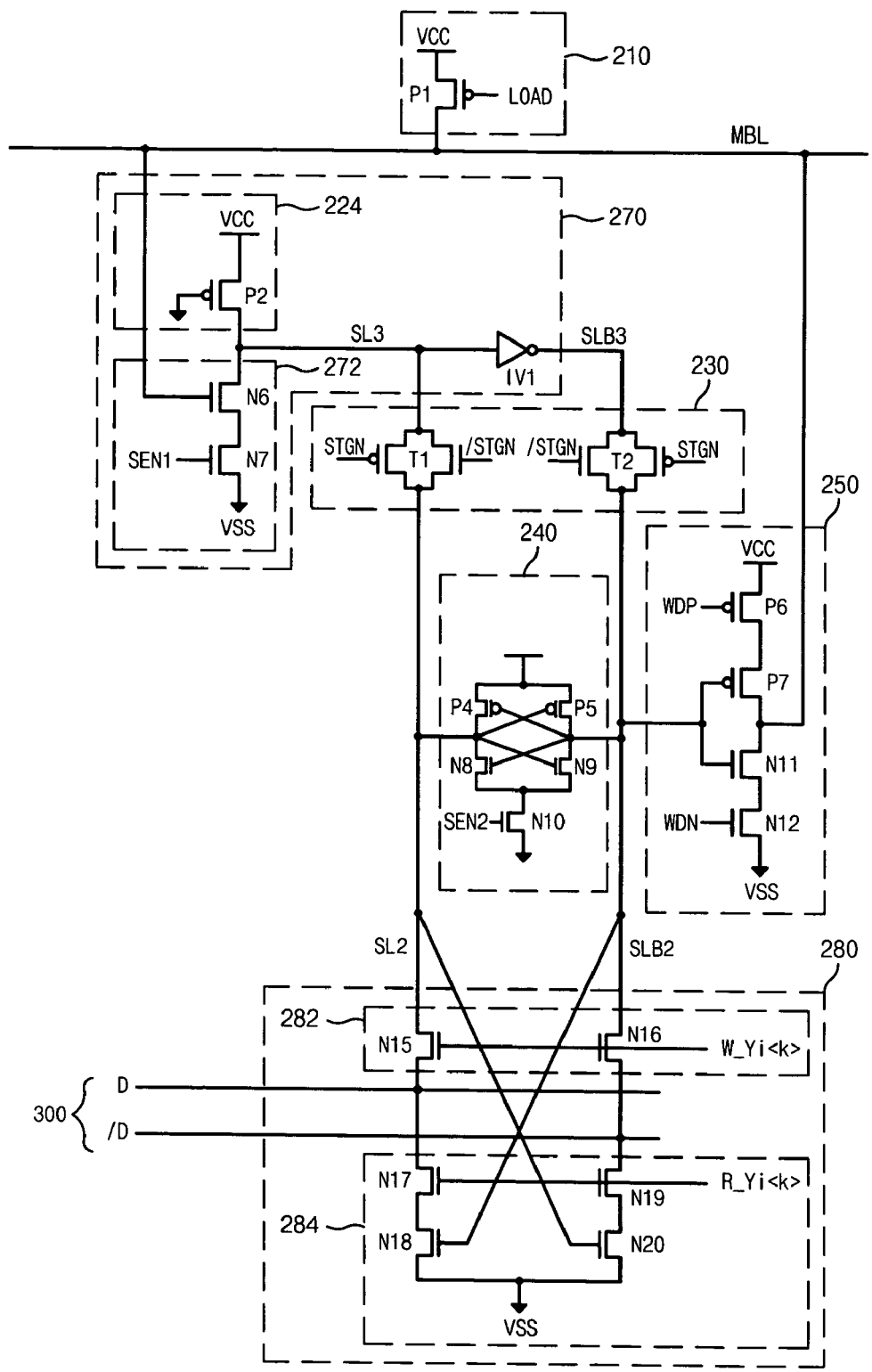
FIG. 9 is a detailed circuit diagram illustrating the structure of each sense amp according to a fourth embodiment of the present invention.

FIG. 9 is a circuit diagram illustrating in detail the structure of each sense ample S/A<0>–S/A<m> according to a fourth embodiment of the present invention.

Except for the structure of the column switch 280, the other elements shown in FIG. 9 are the same with the elements in FIG. 7 both in structures and operations. The column switch 280 of FIG. 9 is the same with the column switch 280 of FIG. 8. Therefore, no further description will be provided here on the sense amp of FIG. 9.

Figure 10:
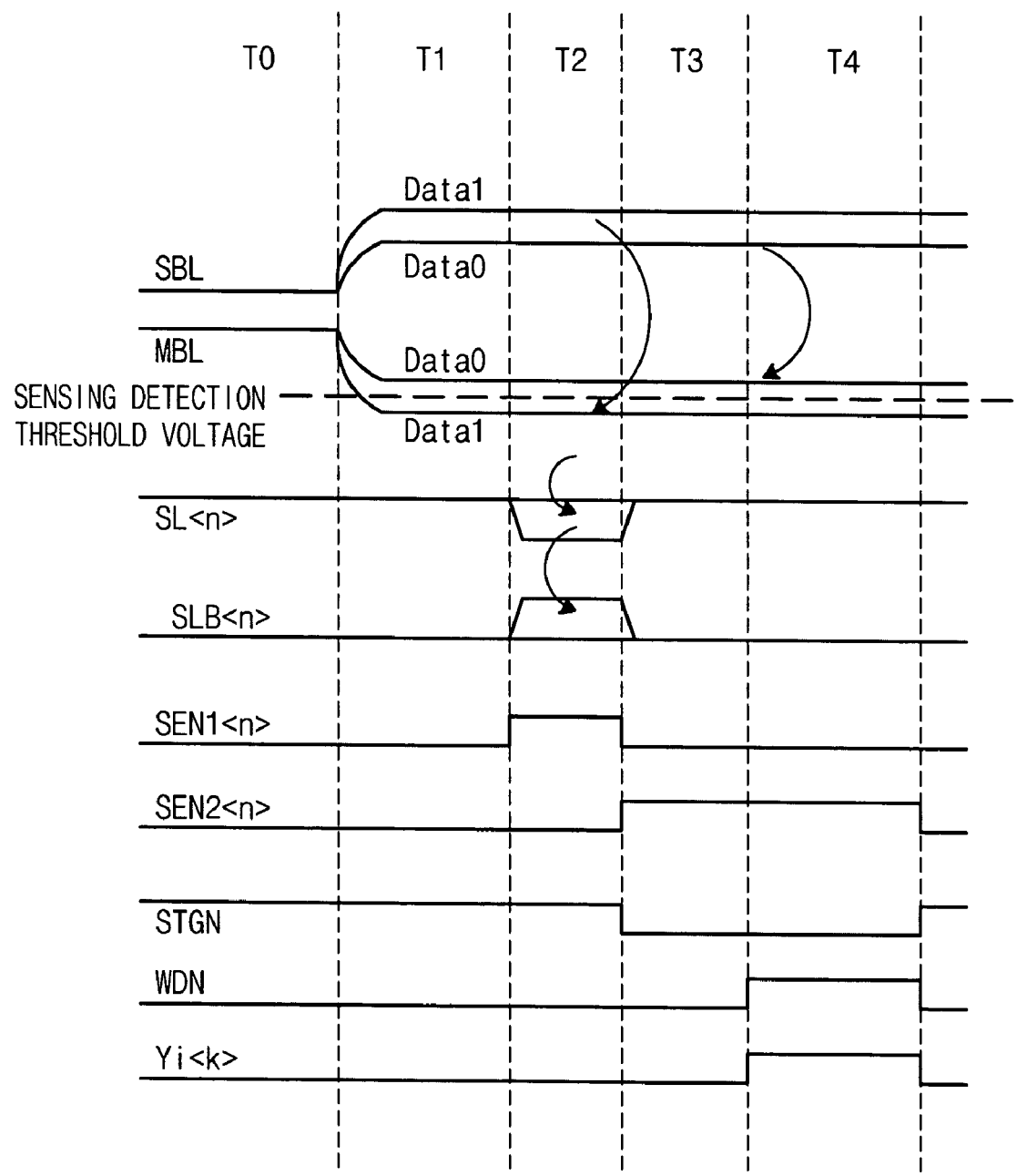
FIG. 10 is a timing diagram for describing the operation of a sense amp in FIG. 6 to FIG. 9.

FIG. 10 is a timing diagram for describing the operation of the sense amp illustrated in FIG. 6 to FIG. 9.

In T1 period, if a specific unit cell is selected, a specific data value is applied to the sub bit line SBL. The level of voltage on the sub bit line SBL varies according to a cell data. If the voltage on the sub bit line SBL increases, the NMOS transistor N2 is turned on and a current flows from the main bit line MBL to the ground voltage direction. Because of the current leakage by the NMOS transistor N2, the voltage on the main bit line MBL being pre-charged to a high level goes down. At this time, the level of the voltage on the sub bit line SBL, namely, the amount of current flowing through the NMOS transistor N2, is changed according to the cell data. In other words, the voltage on the main bit line MBL is changed in dependence of the cell data.

The voltage on the main bit line MBL is then used as the sensing input of the sensing amplifying unit 220 or 270.

In T2 period, the voltage on the main bit line MBL is compared to the threshold voltage (sensing detection threshold voltage) of the input sensing part 222 or 272, and if the voltage on the main bit line MBL is changed enough to do data sensing, the sensing control signal SEN1 is activated. When the sensing control signal SEN1 is activated, the input sensing part 222 or 272 senses the voltage on the main bit line MBL or amplifies it, and the sensed read data is outputted to the nodes SL1, SLB1 or SL3, SLB3.

In T3 period, if the sensing control signal SEN2 is activated and the control signal STGN is inactivated to a low level, the read data in the nodes SL1, SLB1 or SL3, SBL3 are latched by the data latch unit 240.

In T4 period, the latched data by the data latch unit 240 is transferred to the local data bus 300 at the activation of the column selection signal Yi<k> and is read, and is transferred to the main bit line MBL at the activation of the write control signal WDN.

Here, if the temperature of the non-volatile memory device is changed, the signal transfer characteristic of the main bit line MBL is also changed. That is to say, if the temperature goes higher, the voltage level of the main bit line MBL is raised as well. Therefore, it is necessary to compensate the characteristic change of the main bit line MBL. To do this, the preset invention suggests increasing the voltage level of the node SL1 or SL3 if the voltage level of the main bit line MBL has been increased due to a temperature increase of the memory device, so that the sensing detection threshold voltage of the sensing amplifying unit 222 or 272 can be changed. In effect, since the sensing load adjusting part 224 of the invention is always in 'on' state, in the case that temperature of the memory device increases it serves to raise the voltage level of the node SL1 or SL3.

Figure 11:
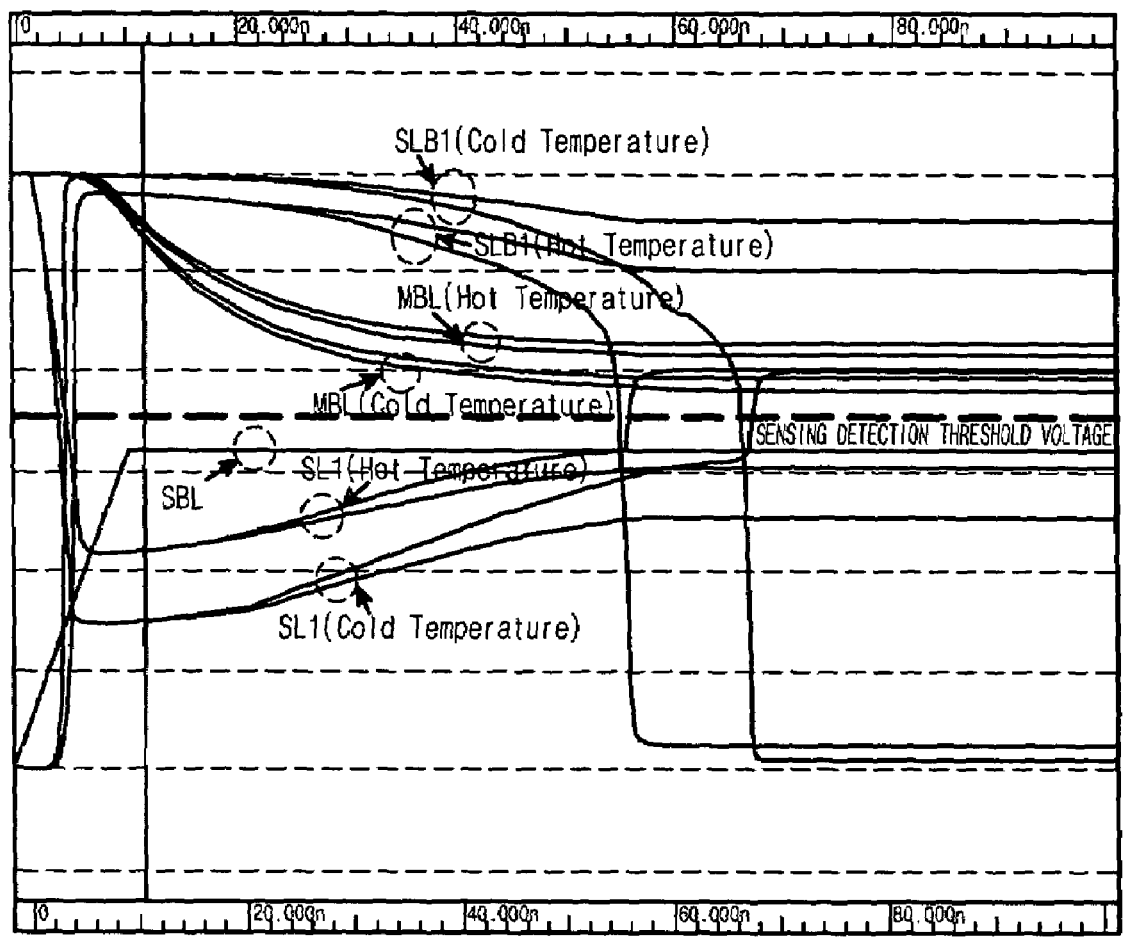
FIG. 11 graphically illustrates a temperature characteristic of a sense amp in FIG. 6 and FIG. 8 against temperature change.

FIG. 11 graphically illustrates how the temperature of the sense amp of FIGS. 6 and 8 changes against the temperature change in the memory device. More specifically, FIG. 11 shows the signal transfer characteristics of the main bit line MBL and the nodes SL1, SLB1 against the temperature change, given that the voltage level on the sub bit line remains constant.

Figure 12:
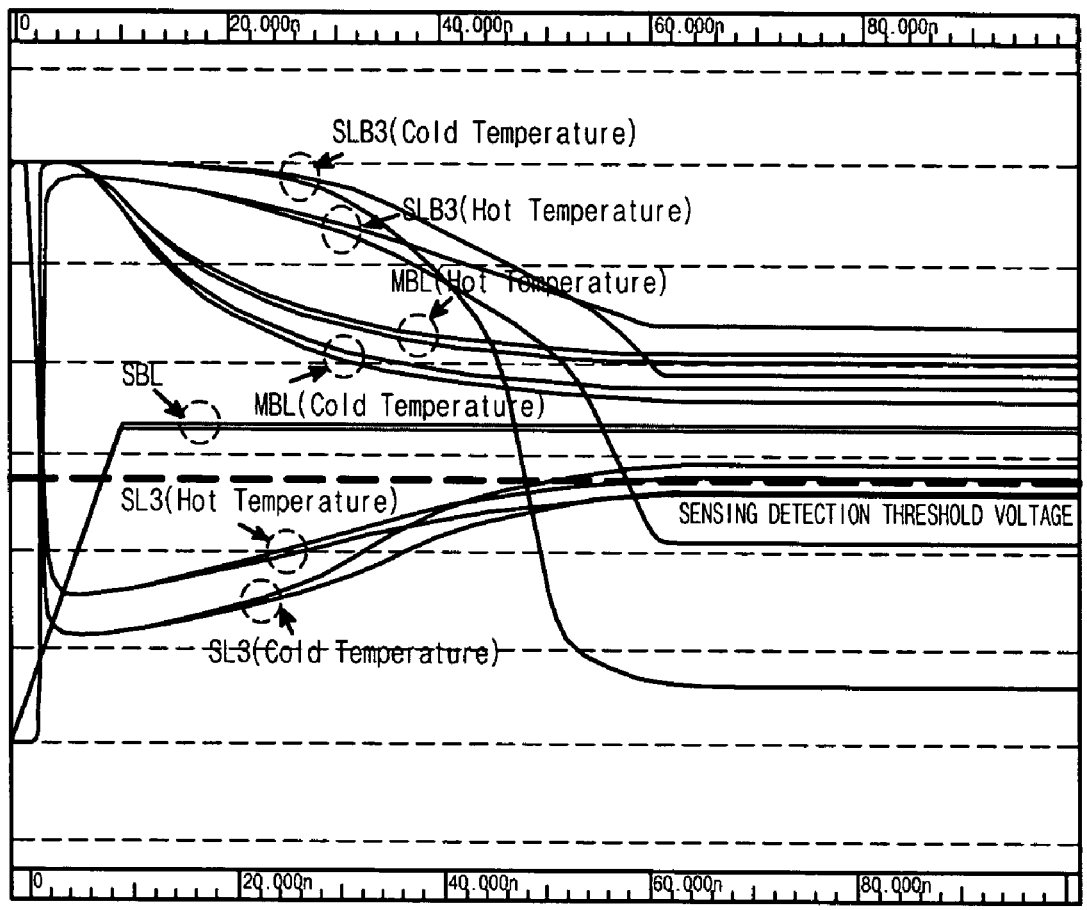
FIG. 12 graphically illustrates a temperature characteristic of a sense amp in FIG. 7 and FIG. 9 against temperature change.

Likewise, FIG. 12 graphically illustrates how the temperature of the sense amp of FIGS. 7 and 9 changes against the temperature change in the memory device. More specifically, FIG. 12 shows the signal transfer characteristics of the main bit line MBL and the nodes SL3, SLB3 against the temperature change, given that the voltage level on the sub bit line remains constant.

Figure 13:
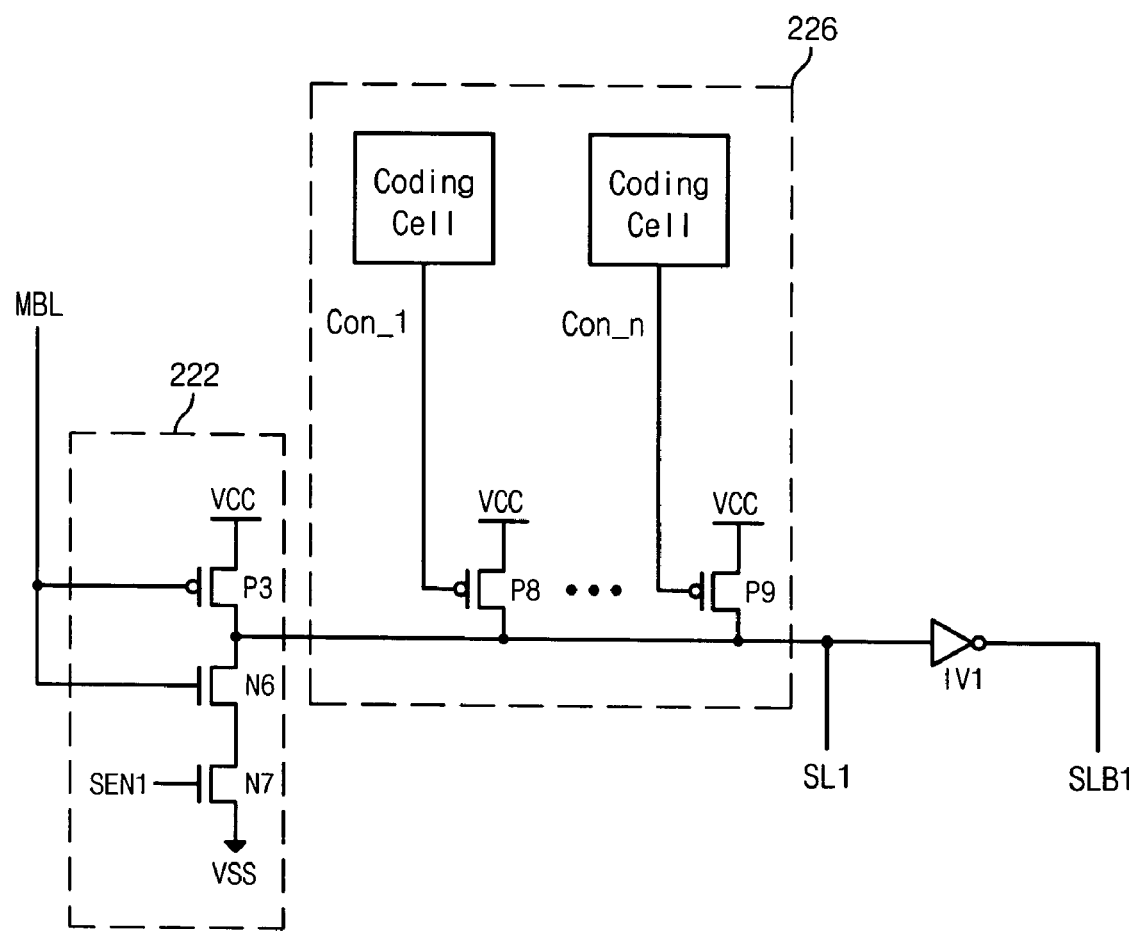
FIG. 13 illustrates another embodiment of a sensing load control unit of sense amp in FIG. 6 and FIG. 8.
Figure 14:
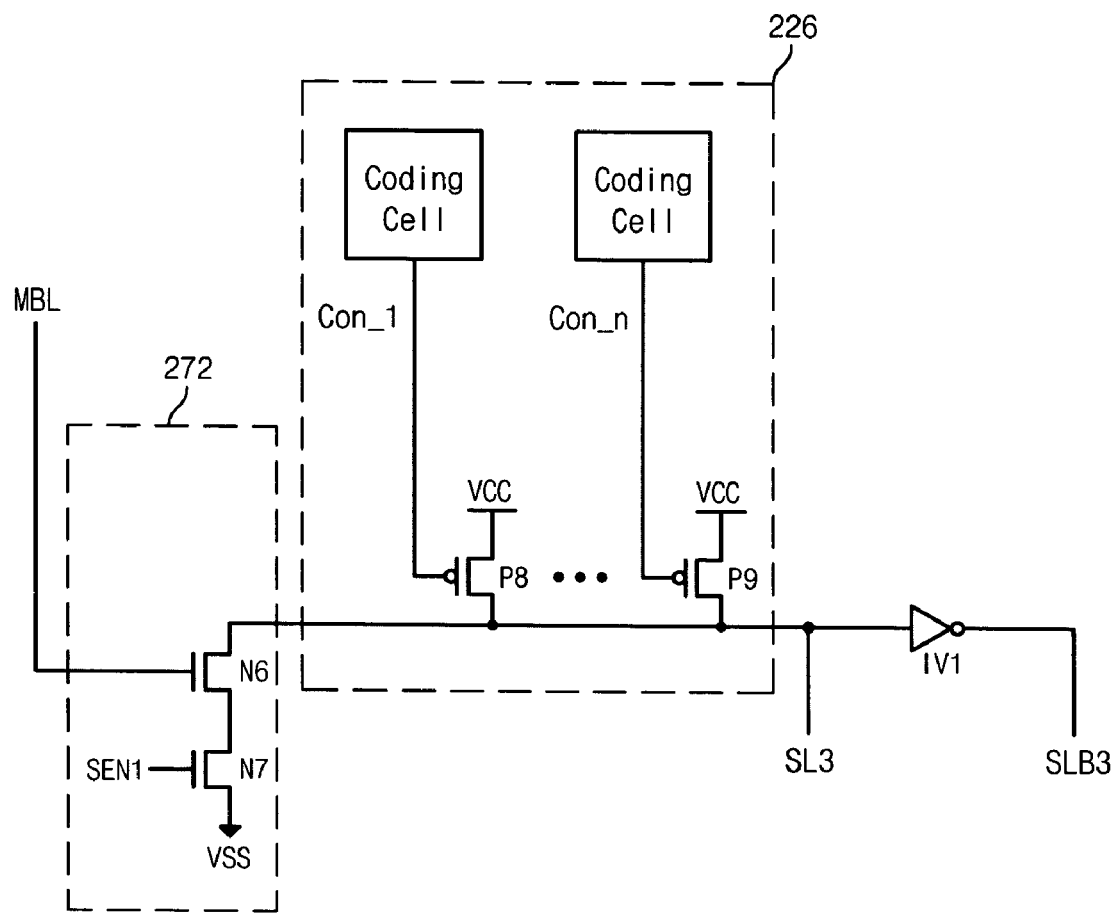
FIG. 14 illustrates another embodiment of a sensing load control unit of sense amp in FIG. 7 and FIG. 9.

FIG. 13 and FIG. 14 are circuit diagrams illustrating another embodiment of the sensing load adjusting part.

As shown in FIGS. 13 and 14, the sensing load adjusting part 226 includes a plurality of PMOS transistors P8, P9 which are connected in parallel between a power voltage VCC and a node SL1 and have a gate to which switching control signals CON_1–CON_n are applied, being selectively turned on/off; and a plurality of non-volatile coding cells which are in a one-to-one correspondence to the plurality of PMOS transistors P8, P9 and output the switching control signals CON_1–CON_n, according to a programmed state to, to control the on/off state of the PMOS transistors P8, P9.

As described above, by selectively turning on/off the PMOS transistors P8, P9, the sensing load on the node SL1 or SL3 can be adjusted to be programmable. Alternatively, by differentiating the size of the respective PMOS transistors P8, P9, the sensing load on the node SL1 or SL3 can be adjusted more minutely.

In the above embodiment, because a ferroelectric memory device storing 1-bit data in one single unit cell only requires one sensing detection threshold voltage, one sensing amplifying unit 220 was sufficient for all of the sense amps S/A<0>–S/A<m>. However, by dividing the sensing voltage on the main bit line MBL into multi levels, a non-volatile ferroelectric memory device having a multi-bit control function (i.e. a plurality of bit values are stored in one unit cell) now requires a plurality of sensing detection threshold voltages. Techniques associated with the multi-bit control function are disclosed in Korean Patent Application No. 2003-62759 applied by the same inventor of the present invention, so no details on that subject matter will be provided here.

Figure 15:
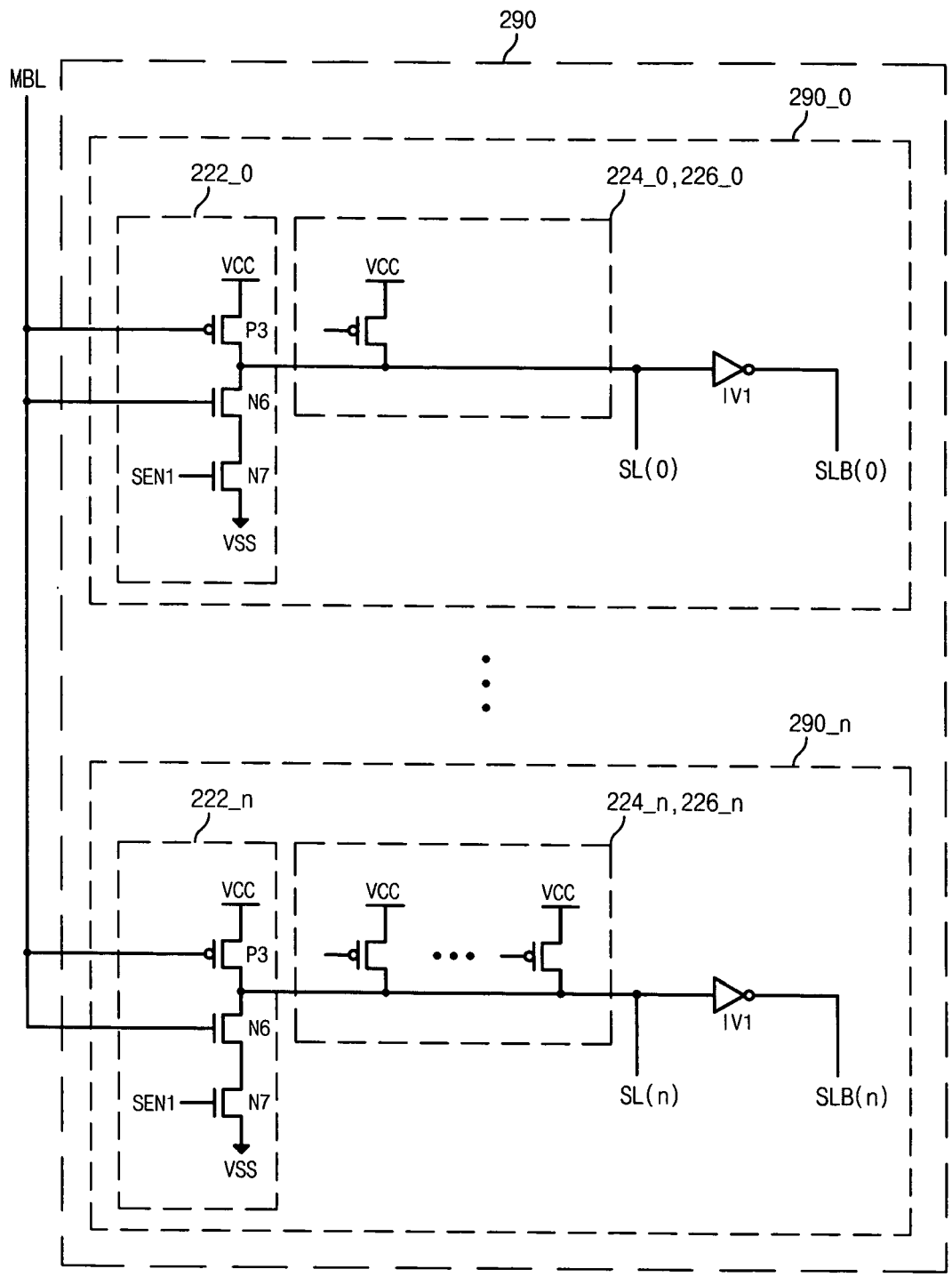
FIG. 15 is a circuit diagram illustrating the structure of a sensing amplifying unit in a non-volatile ferroelectric memory device having a multi-bit control function.
Figure 16:
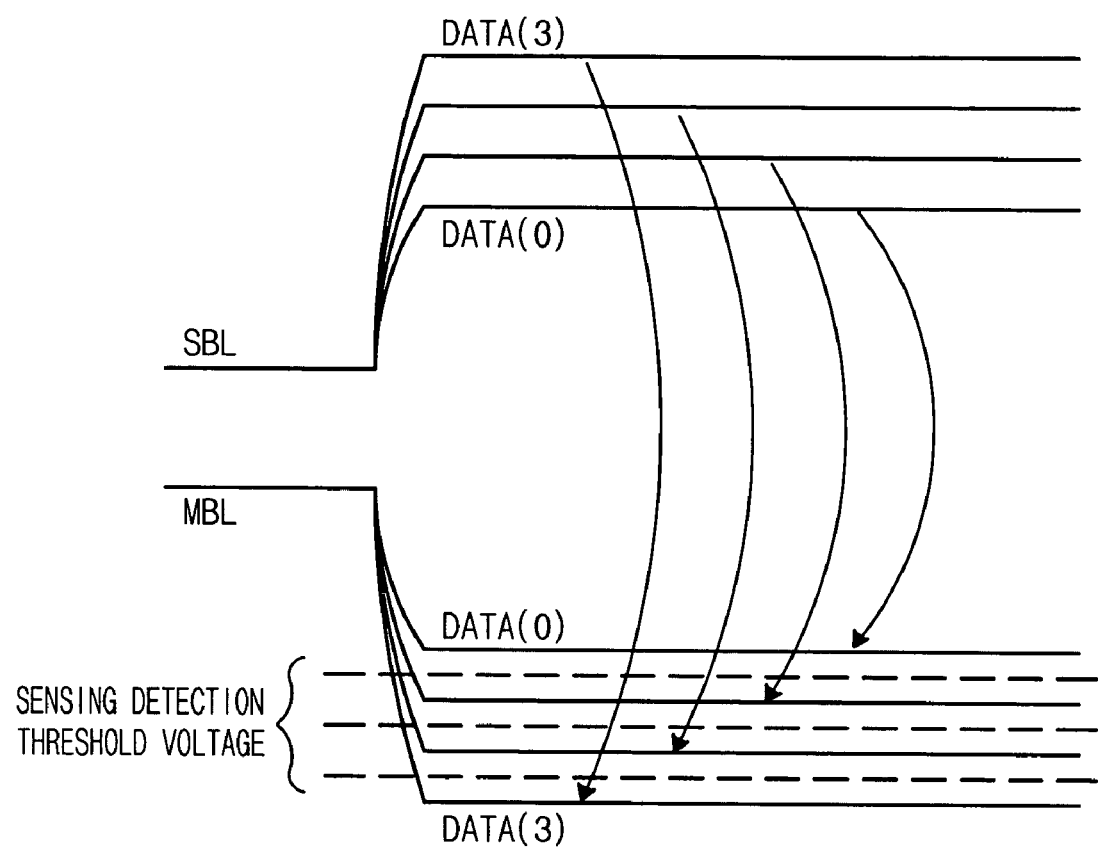
FIG. 16 diagrammatically illustrates the technical principle of sensing data in multi-levels through a sensing amplifying unit of FIG. 15.

FIG. 15 is a circuit diagram illustrating the structure of a sense amp in a non-volatile ferroelectric memory device having a multi-bit control function, and FIG. 16 diagrammatically illustrates the technical principle of sensing a data in multi-levels through the sensing amplifying unit of FIG. 15.

As depicted in FIG. 15, a sensing amplifying unit array 290 includes a plurality of sensing amplifying parts 290_n–290_n, sensing and amplifying a voltage on the main bit line MBL by using a sensing detection threshold voltage in different levels. In other words, a plurality of the sensing amplifying parts 290_0–290_n, as shown in FIG. 16, senses a voltage on the main bit line MBL by using a sensing detection threshold voltage in different levels, and senses a multi-bit data. Data DATA(0)–DATA(3) in FIG. 16 are the multi-bit data.

Each sensing amplifying part 290_0–290_n includes sensing load adjusting parts 224_0–224_n or 226_0–226_n, which are in one-to-one correspondence to input sensing parts 222_0–222_n. Each sensing load adjusting part 224_0–224_n or 226_0–226_n applies different sizes of load to its corresponding input sensing part 222_0–222_n to adjust the sensing detection threshold voltage of each sensing amplifying part 290_0–290_n. To this end, as shown in FIG. 15, each sensing load adjusting part 224_0–224_n or 226_0–226_n has a different number of PMOS transistors connected between a power voltage VCC and a node SL(0)–SL(n).

Although the input sensing parts 222_0–222_n in FIG. 15 have the same structure with the input sensing parts in the first and third embodiments, they can also have the structure(s) illustrated in the second and fourth embodiments. In addition, gates of the PMOS transistors of the respective sensing load adjusting parts 224_n or 226_0–226_n of FIG. 15 can be grounded or connected to non-volatile coding cells.

In the case that the sensing amplifying array 290 of FIG. 15 is provided, a plurality of data latching units (not shown) corresponding to each node SL(0)–SL(n), SLB(0)–SLB(n) is also needed.

Figure 17:
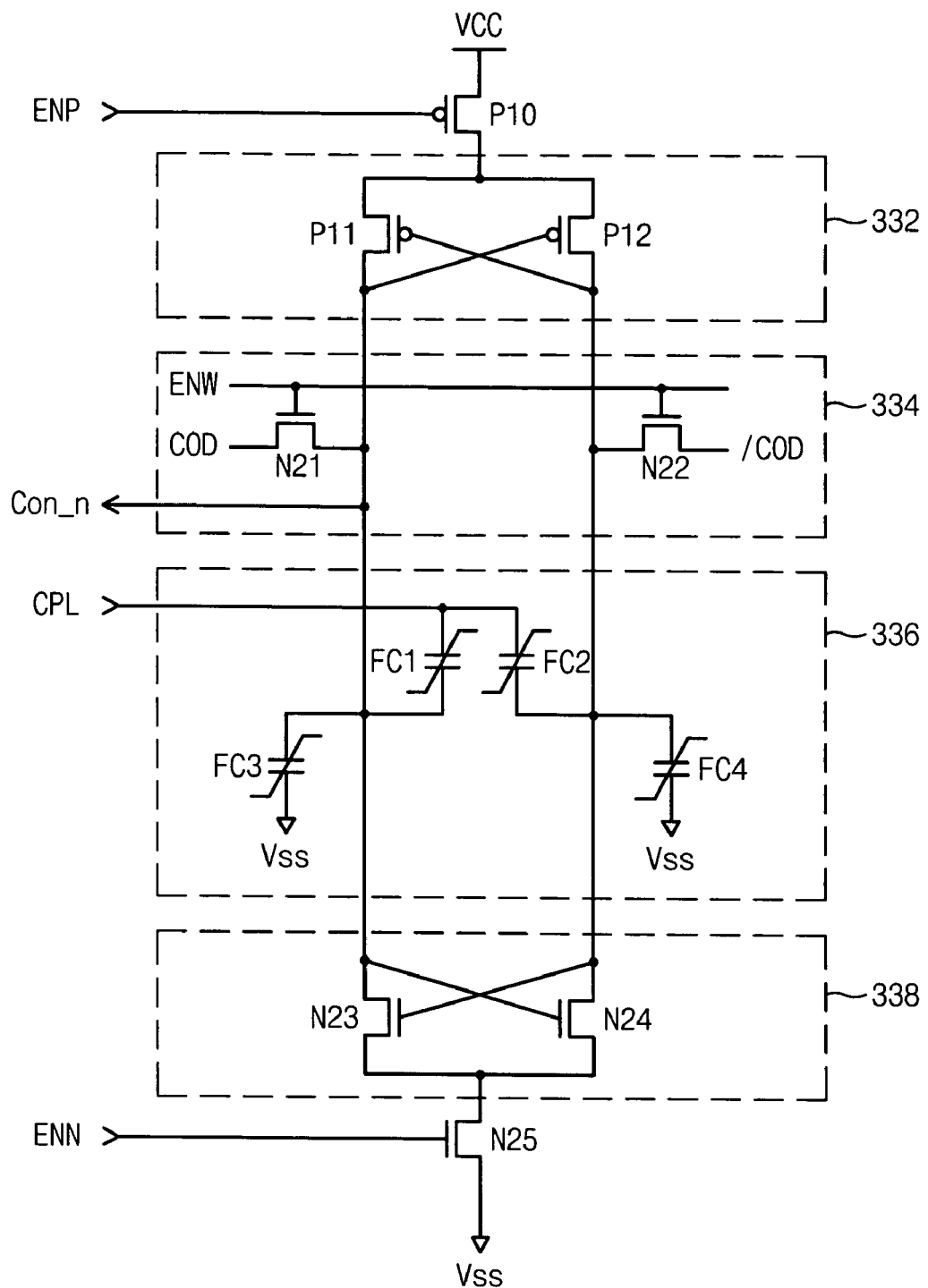
FIG. 17 is a circuit diagram illustrating the structure of a non-volatile coding cell of FIG. 13 and FIG. 14.

FIG. 17 is a circuit diagram illustrating the structure of the non-volatile coding cell of FIG. 13 and FIG. 14.

The non-volatile coding cell consists of a pull-up switch P10, a pull-up driving unit 332, a data input/output (I/O) unit 334, a ferroelectric capacitor unit 336, a pull-down driving unit 338, and a pull-down switch N25.

The pull-up switch P10 is connected between a power voltage VCC and the pull-up driving unit 332 and is formed of a PMOS transistor with a gate where a pull-up enable signal ENP is applied. Thus, when the pull-up enable signal ENP is activated, the pull switch P10 applies the power voltage VCC to the pull-up driving unit 332.

The pull-up driving unit 332 drives the power voltage VCC applied through the pull up switch P10. The pull-up driving unit 332 is located between the pull-up switch P10 and the ferroelectric data I/O unit 334 and includes a pair of PMOS transistors P11, P12 having a cross-coupled latch structure.

The data I/O unit 334 receives coding data COD, /COD according to a write enable signal ENW, and outputs a switching control signal CON_n when a cell plate signal CPL is activated.

The ferroelectric capacitor unit 336 generates a voltage difference in both output nodes according to the cell plate signal CPL, and stores the data COD, /COD.

The pull-down driving unit 338 is connected between output nodes on both sides of a latch structure and drives the ground voltage applied through a pull-down switch N25. The pull-up driving unit 338 is located between the ferroelectric capacitor unit 336 and the pull-down switch N25, and includes NMOS transistors N23, N24 having a cross-coupled latch structure between output nodes.

The pull-down switch N25 is connected between the pull-down driving unit 338 and a ground voltage VSS, and is formed of an NMOS transistor having a gate where a pull-down enable signal ENN is applied. When the pull-down enable signal ENN is activated, the pull-down switch N25 applies the ground voltage VSS to the pull-down driving unit 338.

The cell plate signal CPL transits to a high level by a power-up detection pulse that is generated when the power goes to a stable level. When the cell plate signal CPL in a high level is applied, charges stored in the ferroelectric capacitors FC1, FC2 generate a voltage difference between output nodes by a capacitance load of ferroelectric capacitors FC3, FC4. When the voltage difference generated between the output nodes on both sides of a register is sufficiently large, the pull-up enable signal ENP and the pull-down enable signal ENN are activated to 'low' and 'high', respectively, and as a result, data on both output nodes are amplified. Once the amplification is complete, the cell plate signal CPL transits back to a low level, and a 'high' data having been destroyed in the ferroelectric capacitor FC1 or FC2 is restored again.

Figure 18:
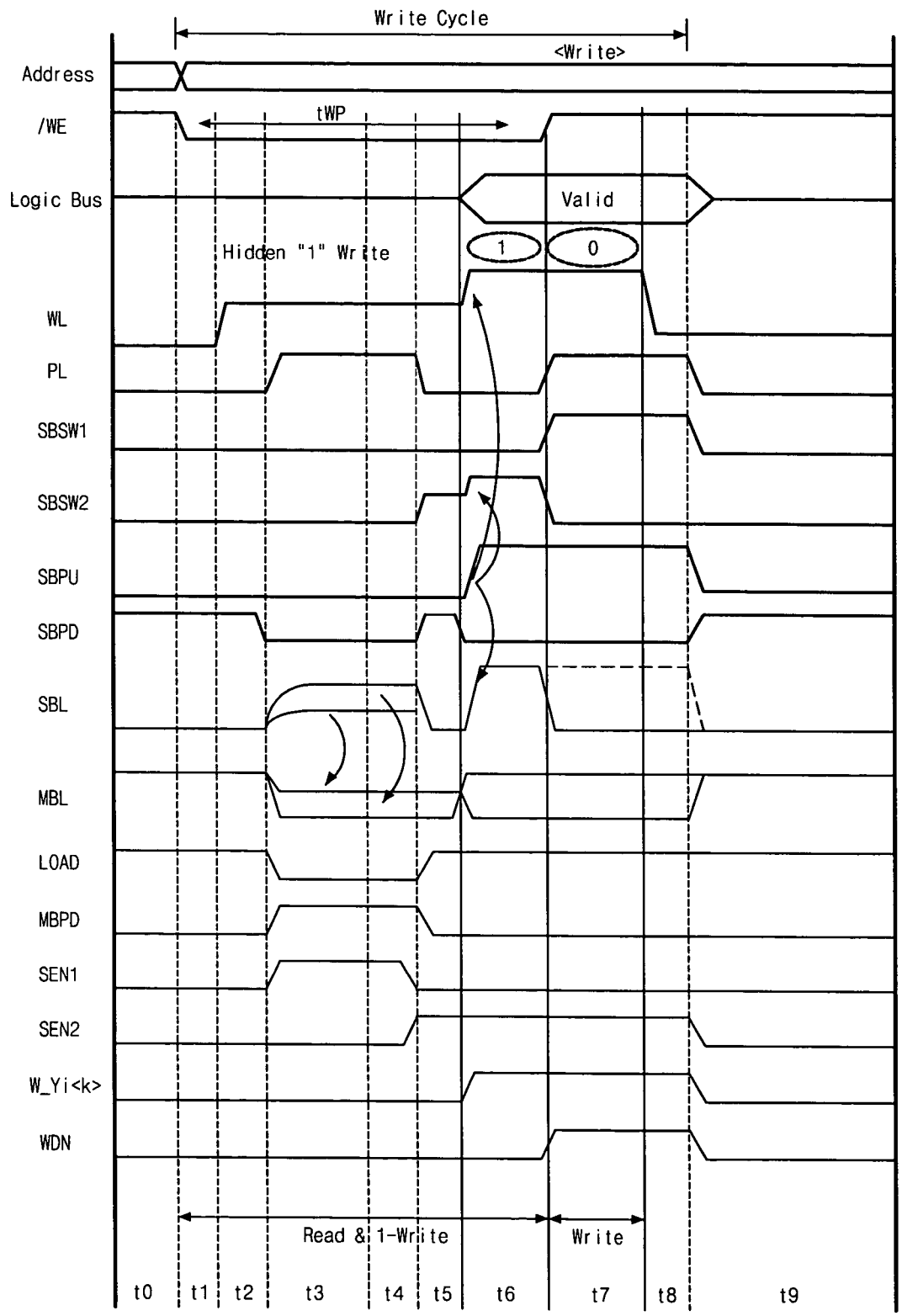
FIG. 18 is a timing diagram for describing a write operation of a non-volatile ferroelectric memory device according to the present invention.

FIG. 18 is a timing diagram for describing a write operation of the non-volatile ferroelectric memory device according to the present invention.

In t0 period, the address is transited and the write enable signal /WE is inactivated to a low level, the memory device is put in a write mode active state.

In periods of t0 and t1, because the sub bit line pull-down signal SBPD is activated before the word line WL and the plate line PL are activated, the sub bit line SBL is pulled down.

In t2 period, the word line WL is enabled and the sub bit line pull-down signal SBPD is disabled to low, so that the storage node of a cell is initialized to a ground level. In this case, by activating the word line WL a certain amount of time before the plate line PL is activated, the storage node of the cell during the initialization state can be stabilized and a sensing margin can be improved.

A t0 period is a sensing period. When the plate line PL is activated in t3 period, a cell data is applied to the sub bit line SBL. Accordingly, the voltage on the sub bit line goes to different levels according to the cell data. When the NMOS transistor N2 is turned on due to the voltage increase on the sub bit line SBL, given that the main bit line pull-down signal MBPD had been activated, the voltage on the main bit line MBL being pre-charged to a high level is reduced.

At this time, when the sensing control signal SEN1 is activated, the voltage on the main bit line MBL is sensed by the sensing amplifying part 222 or 272.

The sensed data is then stored in the data latch unit 240 in t5 period, at the activation of the control signal SEN2.

Entering t5 period, the voltage level of the plate line PL is inactivated to 'low' and the sub bit line selection signal SBSW2 is activated. And, the sub bit line pull-down signal SBPD is activated to 'high', resultantly lowering the voltage on the sub bit line SBL down to the ground level.

Entering t6 period, a high voltage is applied as the sub bit line pull-up signal SBPU and the sub bit line selection signal SBSW2 is pumped. Then the voltage level of the sub bit line SBL goes up to a pumping voltage VPP level. Therefore, regardless of an external data, a high data Hidden "1" is written in every cell coupled to the activated word line WL. Also, as the write column selection signal W_Yi<k> is activated, data applied through the local data bus 300 are latched by the data latch unit 240.

In t7 period, when the write enable signal /WE and the write control signals WDN, WDP are activated, the stored data in the data latch unit 245 are transferred to the main bit line MBL. The data of the main bit line MBL are then transferred to the sub bit line SBL by the activated sub bit line selection signal SBSW1, and are written in the cell. At this time, if the data of the sub bit line SBL is 'high', the data Hidden "1" written during the t6 period is kept. If the data of the sub bit line SBL is 'low', however, a low data is written in a corresponding cell.

After a data write operation is complete, in t8 period, the word line WL is inactivated a certain amount of time before the plate line PL is inactivated.

Figure 19:
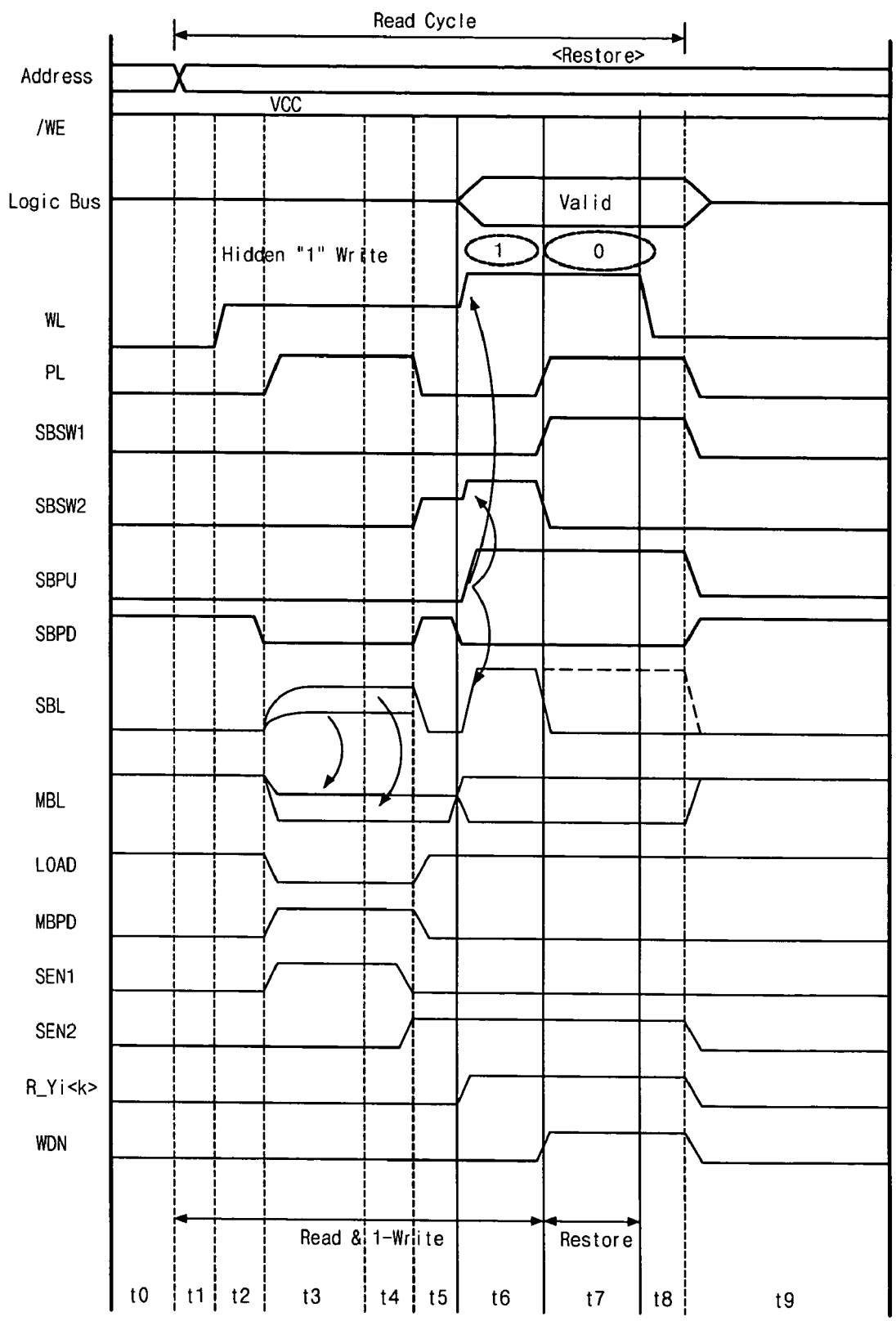
FIG. 19 is a timing diagram for describing a read operation of a non-volatile ferroelectric memory device according to the present invention.

FIG. 19 is a timing diagram for describing a read operation of the non-volatile ferroelectric memory device according to the present invention.

In read mode, the write enable signal /WE maintains the power voltage level.

In t6 period, the read column selection signal R_Yi<k> is activated, so that the stored data in the data latch unit 240 is transferred to the local data bus 300.

In t7 period, the write control signal WDN is activated, so that the stored data in the data latch unit 240 is transferred to the main bit line MBL. At this time, the write column selection signal W_Yi<n> is maintained in a low level, so the data inputted through the local data bus 300 is blocked and the read data stored in the data latch unit 240 is restored in the cell again.

In period of t6–t8, the read column selection signal R-Yi<n> is activated to transfer the stored data in the data latch unit 240 to the local data bus 300.

After restoring data is complete, the word line WL is inactivated a certain amount of time before the plate line PL is inactivated.

In conclusion, the non-volatile ferroelectric memory device having a sensing voltage control function can be advantageously used for realizing a stable data sensing by compensating, through the sense amp, the signal transfer characteristic of the main bit line depending on the temperature change.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A non-volatile ferroelectric memory device having a sensing voltage control function, the device comprising:
   a plurality of cell array blocks having a hierarchy bit line architecture having main bit lines and sub bit lines, and storing data in unit cells selectively connected to the sub bit lines;
   a plurality of sense amplifier units being in a one-to-one correspondence to the cell array blocks, sensing a voltage on the main bit line according to a sensing detection threshold voltage, and adjusting a level of the sensing detection threshold voltage according to a temperature;
   a data bus transferring a read data sensed by the sense amplifier and a write data to be transferred to the sense amplifier; and
   a main amplifier amplifying the read data applied from the data bus, and outputting the amplified read data to a data buffer.

2. The device according to claim 1, wherein the sense amplifier unit comprises a plurality of sense amplifiers, each being directly connected to the main bit line in a one-to-one correspondence, inverting and amplifying a voltage on the main bit line by using a logic threshold voltage as the sensing detection threshold voltage, and adjusting a voltage level of an output signal thereof according to the temperature.

3. The device according to claim 2, wherein the data bus comprises:

a plurality of local data buses, each being in a one-to-one correspondence to the sense amplifier unit, and transferring a read data sensed by the sense amplifier and a write data to be transferred to the sense amplifier;

a global data bus being shared by the plurality of local data buses, and transferring the read data and the write data; and a plurality of data bus switch arrays selectively connecting the local data buses to the global data bus.

4. The device according to claim 3, wherein the sense amplifier comprises:

a sensing load unit selectively applying a load to the main bit line according to a sensing load signal;

at least one sensing amplifying unit being activated by a first sensing control signal, inverting and amplifying the voltage on the main bit line according to the sensing detection threshold voltage, and changing a voltage level of an output node according to the temperature to adjust a level of the sensing detection threshold voltage;

a data transfer unit selectively transferring the read data sensed by the sensing amplifying unit;

a data latch unit being activated by a second sensing control signal, and storing the read data transferred through the data transfer unit or the write data transferred through the data bus; and a write driving unit being activated by a write control signal, and transferring a data stored in the data latch unit to the main bit line; and a column switch unit being activated by a column selection signal, and selectively connecting the data bus to the data latch unit.

5. The device according to claim 4, wherein the sensing amplifying unit comprises:

an input sensing part inverting and amplifying the voltage on the main bit line according to the sensing detection threshold voltage; and a sensing load adjusting part changing the voltage level of the output node of the input sensing part according to a temperature and thereby, adjusting the level of the sensing detection threshold voltage.

6. The device according to claim 5, wherein the column switch unit comprises:

a write selection part transferring, according to a write column selection signal, the data applied through the data bus to the data latch unit; and a read selection part transferring, according to a read column selection signal, the data stored in the data latch unit to the data bus.

7. The device according to claim 5, wherein the sensing load adjusting part is at least one PMOS transistor which is connected between a power voltage node and the output node of the input sensing part and has a gate to a ground terminal.

8. The device according to claim 5, wherein the sensing load adjusting part comprises:

at least one switching device being turned on/off by a switching control signal, and variably adjusting the voltage level of the output node of the input sensing part; and at least one non-volatile coding cell being in a one-to-one correspondence to the switching devices, and being programmably set to selectively activate the switching control signal according to the programmed state.

9. The device according to claim 8, wherein the switching devices are PMOS transistors having different values of channel resistance.

10. The device according to claim 2, wherein the sense amplifier comprises:

a sensing load unit selectively applying a load to the main bit line according to a sensing load signal;

at least one sensing amplifying unit being activated by a first sensing control signal, inverting and amplifying a voltage on the main bit line according to the sensing detection threshold voltage, and changing a voltage level of an output node according to the temperature to adjust a level of the sensing detection threshold voltage;

a data transfer unit selectively transferring the read data sensed by the sensing amplifying unit;

a data latch unit being activated by a second sensing control signal, and storing the read data transferred through the data transfer unit or the write data transferred through the data bus; and a write driving unit being activated by a write control signal, and transferring a data stored in the data latch unit to the main bit line; and a column switch unit being activated by a column selection signal, and selectively connecting the data bus to the data latch unit.

11. The device according to claim 10, wherein the sensing amplifying unit comprises:

an input sensing part inverting and amplifying the voltage on the main bit line according to the sensing detection threshold voltage; and a sensing load adjusting part changing the voltage level of the output node of the input sensing part according to a temperature change and thereby, adjusting the level of the sensing detection threshold voltage.

12. The device according to claim 11, wherein the column switch unit comprises:

a write selection part transferring, according to a write column selection signal, the data applied through the data bus to the data latch unit; and a read selection part transferring, according to a read column selection signal, the data stored in the data latch unit to the data bus.

13. The device according to claim 11, wherein the sensing load adjusting part is at least one PMOS transistor which is connected between a power voltage node and the output node of the input sensing part and has a gate to a ground terminal.

14. The device according to claim 11, wherein the sensing load adjusting part comprises:

one or more switching devices being turned on/off by a switching control signal, and variably adjusting the voltage level of the output node of the input sensing part; and one or more non-volatile coding cells in a one-to-one correspondence to the switching devices, and being programmably set to selectively activate the switching control signal according to the programmed state.

15. The device according to claim 14, wherein the switching devices are PMOS transistors having different values of channel resistance.

16. The device according to claim 10, wherein the sensing amplifying part is a sensing amplifying array, which compares, according to a first sensing control signal, the voltage on the main bit line with a plurality of sensing detection threshold voltages having different level, senses a multi-bit read data, and amplifies the sensed read data.

17. The device according to claim 16, wherein the sensing amplifying array comprises:
 a plurality of input sensing parts inverting and amplifying the voltage on the main bit line according to the sensing detection threshold voltages having the different level, and outputting the amplified voltage; and
 a plurality of sensing load adjusting parts variably changing each output voltage of the input sensing part and adjusting the levels of the sensing detection threshold voltage.

18. The device according to claim 17, wherein each of the plurality of the sensing load adjusting parts comprises a different number of PMOS transistors which is connected between a power voltage node and the output node of the input sensing part and has a gate to a ground terminal, and variably adjusts sensing detection threshold voltages of a plurality of the input sensing parts.

19. The device according to claim 17, wherein a plurality of the sensing load adjusting parts comprises:
 one or more switching devices being turned on/off according to a switching control signal and variably increasing a voltage level of a output node of the input sensing part; and
 one or more non-volatile coding cells being in a one-to-one correspondence to the switching devices, and being programmably set to selectively activate the switching control signal according to the programmed state, wherein a respective sensing load adjusting part includes a different number of the switching devices and the non-volatile coding cells, in order to variably adjust the sensing detection threshold voltages of a plurality of the input sensing parts.

* * * * *